United States Patent
Do et al.

(10) Patent No.: US 9,524,938 B2
(45) Date of Patent: Dec. 20, 2016

(54) PACKAGE-IN-PACKAGE USING THROUGH-HOLE VIA DIE ON SAW STREETS

(71) Applicant: STATS ChipPAC, Ltd., Singapore (SG)

(72) Inventors: Byung Tai Do, Singapore (SG); Heap Hoe Kuan, Singapore (SG); Seng Guan Chow, Singapore (SG)

(73) Assignee: STATS ChipPAC Pte. Ltd., Singapore (SG)

(*) Notice: Subject to any disclaimer, the term of this patent is extended or adjusted under 35 U.S.C. 154(b) by 576 days.

(21) Appl. No.: 13/845,409

(22) Filed: Mar. 18, 2013

(65) Prior Publication Data
US 2013/0214385 A1  Aug. 22, 2013

Related U.S. Application Data

(60) Division of application No. 11/768,825, filed on Jun. 26, 2007, now Pat. No. 8,445,325, which is a
(Continued)

(51) Int. Cl.
*H01L 23/48* (2006.01)
*H01L 23/52* (2006.01)
(Continued)

(52) U.S. Cl.
CPC ......... *H01L 23/5384* (2013.01); *H01L 21/568* (2013.01); *H01L 21/6835* (2013.01);
(Continued)

(58) Field of Classification Search
CPC .................. H01L 2924/00; H01L 2224/73265; H01L 2224/48227; H01L 2224/32225; H01L 2224/97; H01L 2224/32145; H01L 2924/15311; H01L 2224/48247; H01L 2224/48472; H01L 2224/48091; H01L 2224/73204; H01L 2924/00012; H01L 2924/181; H01L 2924/00014; H01L 2224/0401
See application file for complete search history.

(56) References Cited

U.S. PATENT DOCUMENTS

| | | |
|---|---|---|
| 5,135,891 A | 8/1992 | Ikeno et al. |
| 5,147,822 A | 9/1992 | Yamazaki et al. |

(Continued)

FOREIGN PATENT DOCUMENTS

| | | |
|---|---|---|
| JP | H05211202 A | 8/1993 |
| KR | 1020000061035 | 10/2000 |

(Continued)

OTHER PUBLICATIONS

Jiang et al., "Characterization of Epoxy Resin SU-8 Film Using Thickness-Shear Mode (TSM) Resonator", 2003 IEEE International Frequency Control Symposium and PDA Exhibition Jointly with the 17th European Frequency and Time Forum, May 4-8, 2003, pp. 986-992.

*Primary Examiner* — Meiya Li
(74) *Attorney, Agent, or Firm* — Robert D. Atkins; Patent Law Group: Atkins and Associates, P.C.

(57) ABSTRACT

A semiconductor device includes a first die having top, bottom, and peripheral surfaces. A bond pad is formed over the top surface. An organic material is connected to the first die and disposed around the peripheral surface. A via hole is formed in the organic material. A metal trace connects the via hole to the bond pad. A conductive material is deposited in the via hole. A redistribution layer (RDL) has an interconnection pad disposed over the top surface of the first die.

23 Claims, 30 Drawing Sheets

Related U.S. Application Data continuation-in-part of application No. 11/744,657, filed on May 4, 2007, now Pat. No. 7,569,421.

(51) Int. Cl.
| | |
|---|---|
| *H01L 29/40* | (2006.01) |
| *H01L 23/538* | (2006.01) |
| *H01L 21/56* | (2006.01) |
| *H01L 21/683* | (2006.01) |
| *H01L 23/00* | (2006.01) |
| *H01L 25/065* | (2006.01) |
| *H01L 25/00* | (2006.01) |
| *H01L 23/31* | (2006.01) |

(52) U.S. Cl.
CPC .............. *H01L 24/96* (2013.01); *H01L 24/97* (2013.01); *H01L 25/0657* (2013.01); *H01L 25/50* (2013.01); *H01L 23/3114* (2013.01); *H01L 23/481* (2013.01); *H01L 24/73* (2013.01); *H01L 2224/05554* (2013.01); *H01L 2224/16145* (2013.01); *H01L 2224/16225* (2013.01); *H01L 2224/32145* (2013.01); *H01L 2224/32225* (2013.01); *H01L 2224/32245* (2013.01); *H01L 2224/45139* (2013.01); *H01L 2224/48091* (2013.01); *H01L 2224/48145* (2013.01); *H01L 2224/48227* (2013.01); *H01L 2224/48247* (2013.01); *H01L 2224/48472* (2013.01); *H01L 2224/73204* (2013.01); *H01L 2224/73265* (2013.01); *H01L 2224/97* (2013.01); *H01L 2225/0651* (2013.01); *H01L 2225/06506* (2013.01); *H01L 2225/06513* (2013.01); *H01L 2225/06541* (2013.01); *H01L 2225/06551* (2013.01); *H01L 2225/06582* (2013.01); *H01L 2924/00014* (2013.01); *H01L 2924/014* (2013.01); *H01L 2924/01005* (2013.01); *H01L 2924/01006* (2013.01); *H01L 2924/01013* (2013.01); *H01L 2924/01015* (2013.01); *H01L 2924/01027* (2013.01); *H01L 2924/01029* (2013.01); *H01L 2924/01033* (2013.01); *H01L 2924/01047* (2013.01); *H01L 2924/01074* (2013.01); *H01L 2924/01078* (2013.01); *H01L 2924/01082* (2013.01); *H01L 2924/09701* (2013.01); *H01L 2924/12042* (2013.01); *H01L 2924/14* (2013.01); *H01L 2924/15173* (2013.01); *H01L 2924/15311* (2013.01); *H01L 2924/15313* (2013.01); *H01L 2924/181* (2013.01); *H01L 2924/19041* (2013.01); *H01L 2924/19042* (2013.01); *H01L 2924/19043* (2013.01); *H01L 2924/19104* (2013.01); *H01L 2924/19107* (2013.01)

(56) References Cited

U.S. PATENT DOCUMENTS

| | | |
|---|---|---|
| 5,161,090 A | 11/1992 | Crawford et al. |
| 5,250,843 A | 10/1993 | Eichelberger |
| 5,258,648 A | 11/1993 | Lin |
| 5,353,498 A | 10/1994 | Fillion et al. |
| 5,619,070 A | 4/1997 | Kozono |
| 5,694,551 A | 12/1997 | Doyle et al. |
| 5,841,193 A | 11/1998 | Eichelberger |
| 6,157,915 A | 12/2000 | Bhaskaran et al. |
| 6,420,244 B2 | 7/2002 | Lee |
| 6,506,632 B1 | 1/2003 | Cheng et al. |
| 6,611,052 B2 | 8/2003 | Poo et al. |
| 6,743,696 B2 | 6/2004 | Jeung et al. |
| 6,768,190 B2 | 7/2004 | Yang et al. |
| 6,790,710 B2 | 9/2004 | McLellan et al. |
| 6,800,930 B2 | 10/2004 | Jackson et al. |
| 6,852,607 B2 | 2/2005 | Song et al. |
| 6,856,023 B2 | 2/2005 | Muta et al. |
| 6,867,471 B2 | 3/2005 | Goller et al. |
| 6,914,327 B2 | 7/2005 | Shizuno |
| 6,949,407 B2 | 9/2005 | Jeung et al. |
| 7,061,088 B2 | 6/2006 | Karnezos |
| 7,064,426 B2 | 6/2006 | Karnezos |
| 7,121,747 B2 | 10/2006 | Hayashi et al. |
| 7,132,747 B2 | 11/2006 | Kwon et al. |
| 7,364,945 B2 | 4/2008 | Shim et al. |
| 7,372,141 B2 | 5/2008 | Karnezos et al. |
| 7,404,199 B2 | 7/2008 | Arneson et al. |
| 7,517,722 B2 | 4/2009 | Goller et al. |
| 7,550,857 B1 * | 6/2009 | Longo ................ H01L 24/19 257/686 |
| 7,569,421 B2 | 8/2009 | Do et al. |
| 7,605,476 B2 | 10/2009 | Gritti |
| 7,619,901 B2 | 11/2009 | Eichelberger et al. |
| 7,687,318 B2 | 3/2010 | Do et al. |
| 7,791,206 B2 | 9/2010 | Takeuchi et al. |
| 2002/0013721 A1 | 1/2002 | Dabbiere et al. |
| 2002/0019761 A1 | 2/2002 | Lidow |
| 2002/0042755 A1 | 4/2002 | Kumar et al. |
| 2002/0045290 A1 | 4/2002 | Ball |
| 2002/0049622 A1 | 4/2002 | Lettich et al. |
| 2002/0167084 A1 | 11/2002 | Coccioli et al. |
| 2004/0035840 A1 | 2/2004 | Koopmans |
| 2004/0119152 A1 | 6/2004 | Karnezos et al. |
| 2004/0227251 A1 | 11/2004 | Yamaguchi |
| 2005/0012195 A1 | 1/2005 | Go et al. |
| 2005/0046002 A1 | 3/2005 | Lee et al. |
| 2005/0051883 A1 | 3/2005 | Fukazawa |
| 2005/0067680 A1 | 3/2005 | Boon et al. |
| 2005/0104181 A1 | 5/2005 | Lee et al. |
| 2005/0184377 A1 | 8/2005 | Takeuchi et al. |
| 2005/0212106 A1 | 9/2005 | Kwon et al. |
| 2006/0012038 A1 | 1/2006 | Miyazaki et al. |
| 2006/0060984 A1 | 3/2006 | Wakabayashi et al. |
| 2006/0071347 A1 | 4/2006 | Dotta |
| 2007/0108625 A1 | 5/2007 | Hsu |
| 2007/0181989 A1 * | 8/2007 | Corisis et al. ............. 257/686 |
| 2008/0054460 A1 | 3/2008 | Hung |
| 2008/0138935 A1 | 6/2008 | Pu et al. |
| 2010/0059885 A1 | 3/2010 | Kuan et al. |

FOREIGN PATENT DOCUMENTS

| | | |
|---|---|---|
| KR | 20040030841 A | 4/2004 |
| TW | 200614404 | 9/1994 |
| TW | 200627616 | 10/1994 |

* cited by examiner

PACKAGE-IN-PACKAGE USING THROUGH-HOLE VIA DIE ON SAW STREETS

CLAIM TO DOMESTIC PRIORITY

The present invention is a division of U.S. application Ser. No. 11/768,825, now U.S. Pat. No. 8,445,325, filed Jun. 26, 2007, which is a continuation-in-part of U.S. patent application Ser. No. 11/744,657, now U.S. Pat. No. 7,569,421, filed May 4, 2007, which applications are incorporated herein by reference.

FIELD OF THE INVENTION

The present invention relates in general to semiconductor devices and, more particularly, to a through-hole via (THV) stackable semiconductor device.

BACKGROUND OF THE INVENTION

In a growing trend, semiconductor manufacturers have increasingly adopted three-dimensional (3D) interconnects and packaging for semiconductor devices. Three-dimensional interconnects give advantages such as size reduction, reduced interconnect length and integration of devices with different functionality within a respective package.

One of the various ways of implementing 3D interconnects involves the use of THV technology. THVs can be located either within a semiconductor device, or die, or outside the die along a saw street guide.

However, current THV technology poses several limitations. A via located within a semiconductor device restricts the freedom of having additional circuitry within the semiconductor device. As can be appreciated, a respective location of a THV forecloses the placement of circuitry at that location. As a result, the functionality of the semiconductor device, and therefore, a device making use of the semiconductor device, is limited.

A via located outside the semiconductor device, i.e., along the saw street guide, necessitates a wider saw street to accommodate the creation of a through-hole. As a result, yields for semiconductor devices per wafer are reduced.

SUMMARY OF THE INVENTION

In light of the foregoing, the aim of the present invention is to provide a THV stackable semiconductor device without having any of the accompanying limitations previously described.

Accordingly, in one embodiment, the present invention is a semiconductor device comprising a first semiconductor die and insulating material disposed around a peripheral region of the first semiconductor die. A conductive via is formed through the insulating material. A redistribution layer including a first bond pad is formed over a surface of the first semiconductor die. A second semiconductor die is disposed over the first semiconductor die and redistribution layer.

In another embodiment, the present invention is a semiconductor device comprising a first semiconductor die and insulating material disposed around a peripheral region of the first semiconductor die. A conductive via is formed through the insulating material. A first bond pad is formed over a surface of the first semiconductor die. A conductive trace is formed over the surface of the first semiconductor die between the conductive via and the first bond pad. A redistribution layer including a second bond pad is formed over the surface of the first semiconductor die.

In another embodiment, the present invention is a semiconductor device a first semiconductor die and insulating material disposed around a peripheral region of the first semiconductor die. A conductive via is formed through the insulating material. A redistribution layer is formed over a surface of the first semiconductor die.

In another embodiment, the present invention is a semiconductor device comprising a first semiconductor die and insulating material disposed around a peripheral region of the first semiconductor die. A conductive via is formed through the insulating material. A conductive trace is formed over a surface of the first semiconductor die and electrically coupled to the conductive via.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

In the following description and claims, the terms "comprise" and "include," along with their derivatives, may be used and are intended as synonyms for each other. In addition, in the following description and claims, the terms "coupled" and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements.

Figure 1:
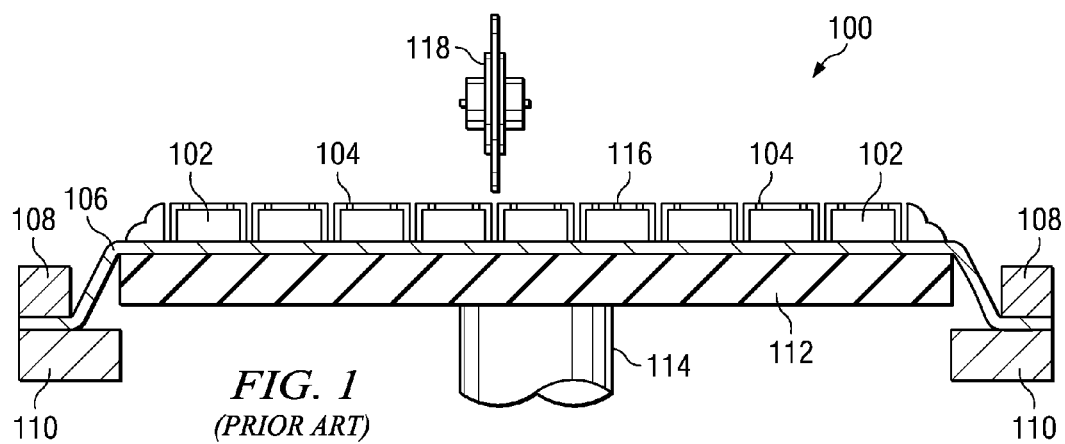
FIG. 1 illustrates an exemplary prior art method of making a wafer level chip scale package.

FIG. 1 illustrates an exemplary prior art method 100 of making a wafer level chip scale package. A plurality of semiconductor devices 102 are cut from a wafer. Each semiconductor device 102 has a plurality of protruding bonding pads 104 located on the active surface of the device.

The plurality of semiconductor devices 102 are disposed on the top surface of a retractable film 106. The retractable film 106 is secured by a frame 108. The frame 108 is fixed by a fixture 110 and retractable film 106 is displaced on a work platform 112 and then stretched.

The platform 112 can move up relative to fixture 110. The wafer is cut by a cutter into the plurality of semiconductor devices 102 as shown, which have been encapsulated into semiconductor packages, and then sawn by cutter 118. A shaft 114 moves upward to lift platform 112 relative to fixture 110.

The present invention improves upon the exemplary prior art method 100 of manufacture to render a through-hole via (THV) semiconductor device which is, in some embodiments, stacked together for specific applications and implementations.

Figure 2A:
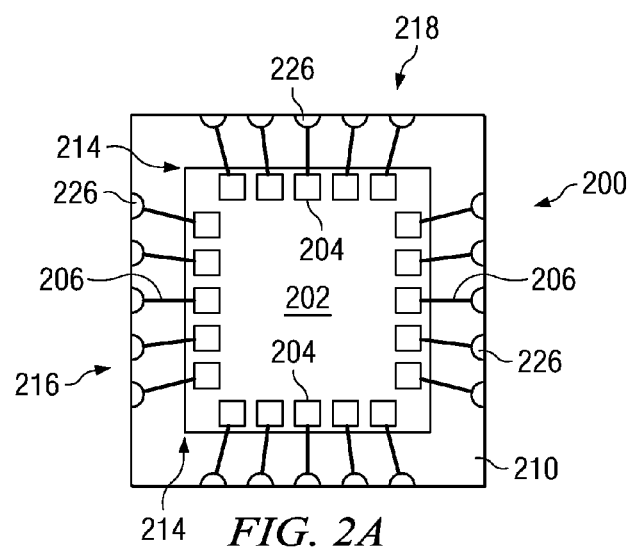
FIGS. 2A and 2B illustrate a first embodiment of a THV stackable semiconductor device in a top and side view, respectively.
Figure 2B:
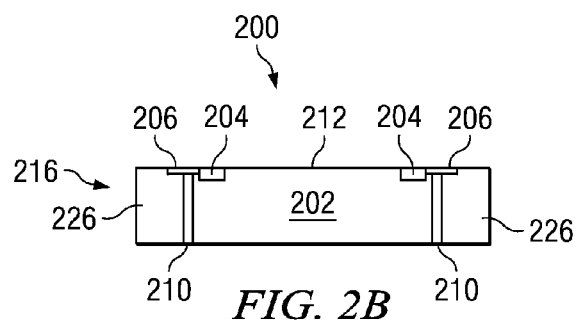

FIGS. 2A and 2B illustrate a first embodiment of a THV stackable semiconductor device 200, in a top and side view, respectively. Device 200 has an incorporated die 202. Device 200 includes a plurality of bond pads 204 which are deposited on an active side of semiconductor die 202. Bonding pads 204 can be deposited on the electrode terminals of die 202 by a plating process, or otherwise. The materials of bonding pads 204 can be made from a conductive metal, such aluminum (Al). Bonding pads 204 can be joined to a substrate by a soldering process.

A series of metal traces 206 electrically couple bond pads 204 to via 226. As shown in FIG. 2B, via 226 extends vertically from the active, top surface 212 of die 202 and surrounding material 210 to a bottom surface of the die and surrounding material 210, which is consistent with a THV design.

The surrounding material 210, which is, for purposes of the present invention, referred to as an "organic material", is deposited around peripheral surface 214 of die 202 as shown. The organic material 210 is an improvement and a departure from that of the prior art, as will be further described. The organic material can include such materials as benzocyclobutene (BCB), a polyimide (PI) material, or similar material. As shown, vias 226 are formed in organic material 210 and organized according to rows. In the present embodiment 200, vias 226 are formed in each side of organic material 210, e.g., sides 216, and 218, so as to completely surround the periphery of die 202. Each of the plurality of bond pads 204 is electrically coupled to each of the plurality of vias 226.

As will be shown, THV 226 can be formed in various configurations, for example, along multiple rows. Further, half-cut vias as shown in the instant figure or complete, uncut vias can be formed in various embodiments to suit particular implementations. The semiconductor device 200 can be stacked or coupled with additional dies 202 in a variety of configurations.

Figure 3A:
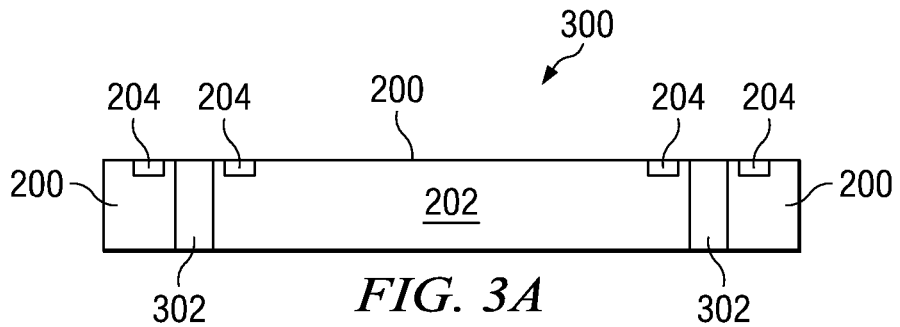
FIGS. 3A and 3B illustrate a first step in a first exemplary method of manufacturing the THV stackable semiconductor device as shown in FIGS. 2A and 2B in a side and top view, respectively.
Figure 3B:
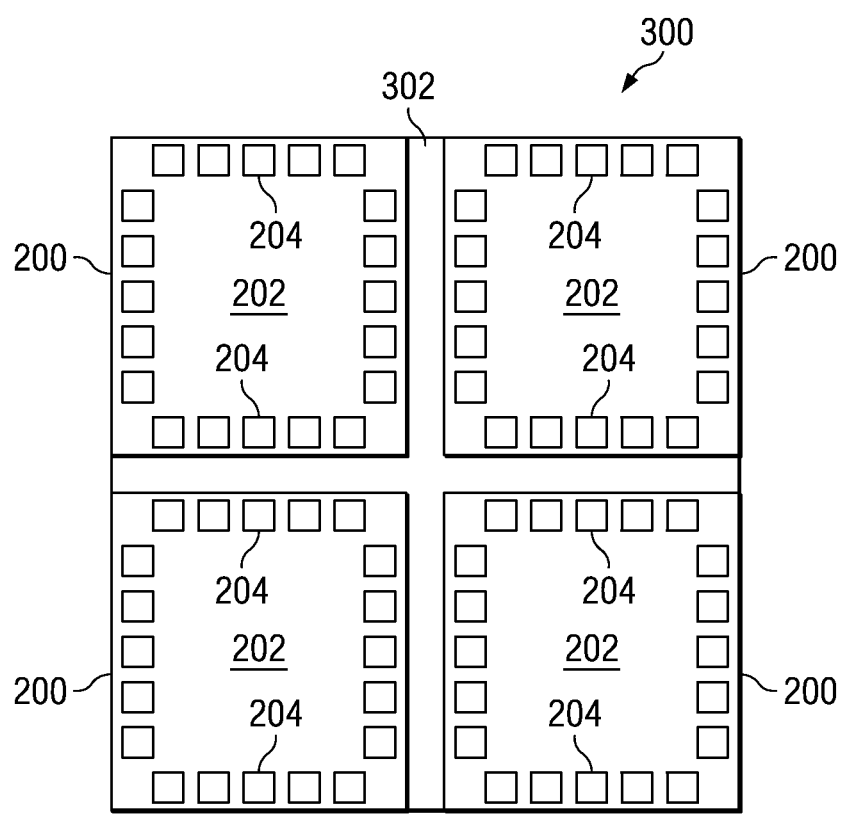

FIGS. 3A and 3B illustrate a first step in a first exemplary method of manufacturing the THV stackable semiconductor device as shown in FIGS. 2A and 2B in a side and top view, respectively. A series of bond pads 204 are formed on an active surface of wafer 300 as shown. The wafer is designated with a saw street guide 302.

Figure 4A:
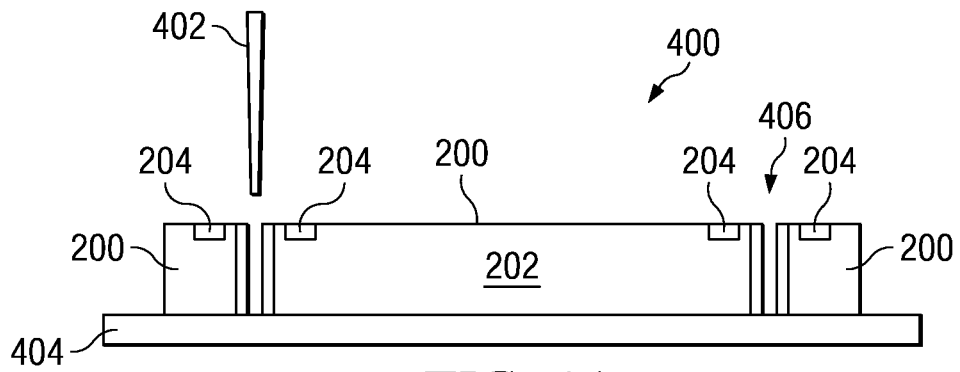
FIGS. 4A and 4B illustrate a second step in a first exemplary method of manufacturing the THV stackable semiconductor device as shown in FIGS. 2A and 2B in a side and top view, respectively.
Figure 4B:
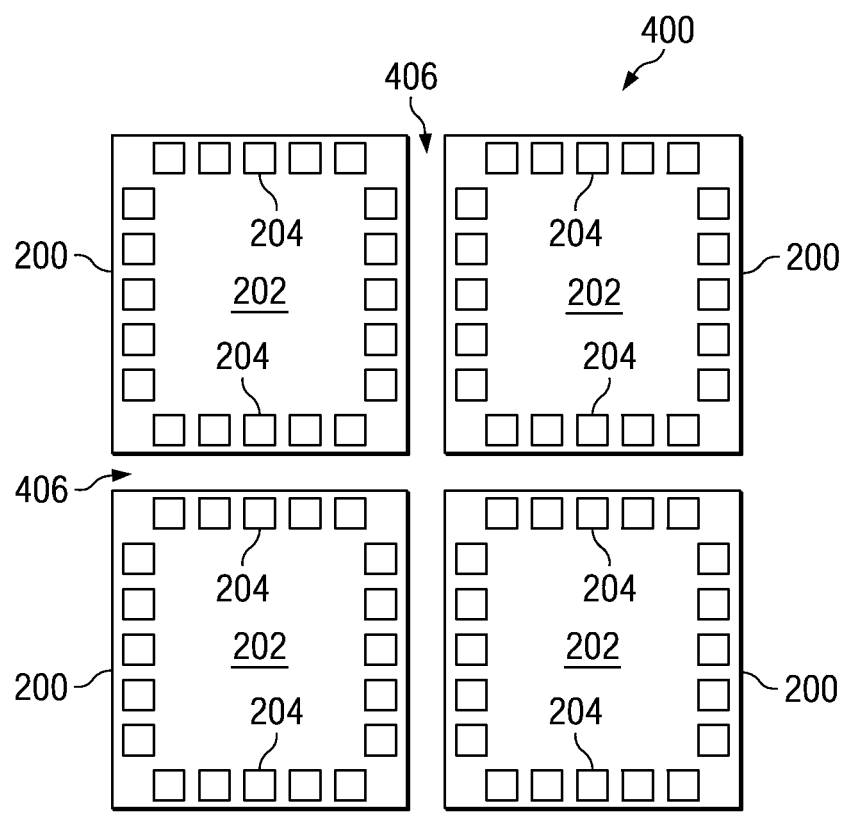

FIGS. 4A and 4B illustrate a second step in the first exemplary method of manufacturing the THV stackable semiconductor device as shown in FIGS. 2A and 2B in a side and top view, respectively. Wafer 300 is singulated into depicted pieces 400 by a cutting source 402. Cutting source 402 can include a saw or laser cutting tool.

Prior to singulation, wafer 300 is placed on a dicing tape 404, which keeps the various segments 400 in place during the singulation process. Subsequent to the singulation process, a series of gaps 406 is formed between respective segments 400 as shown.

Figure 5A:
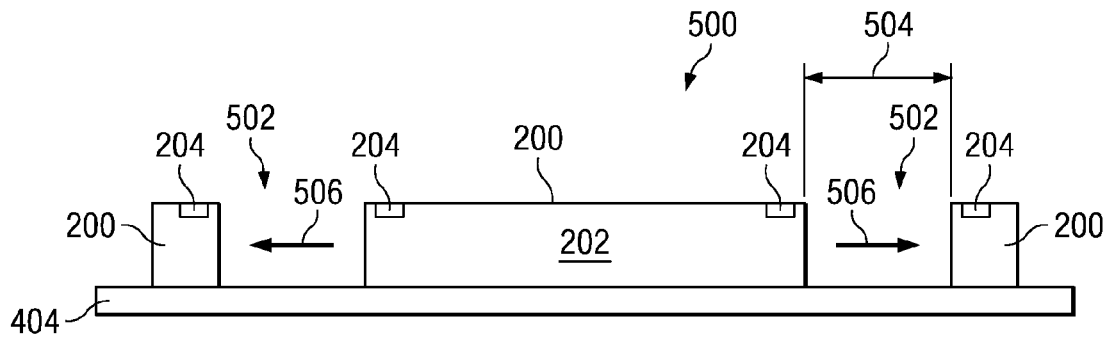
FIGS. 5A and 5B illustrate a third step in a first exemplary method of manufacturing the THV stackable semiconductor device as shown in FIGS. 2A and 2B in a side and top view, respectively.
Figure 5B:
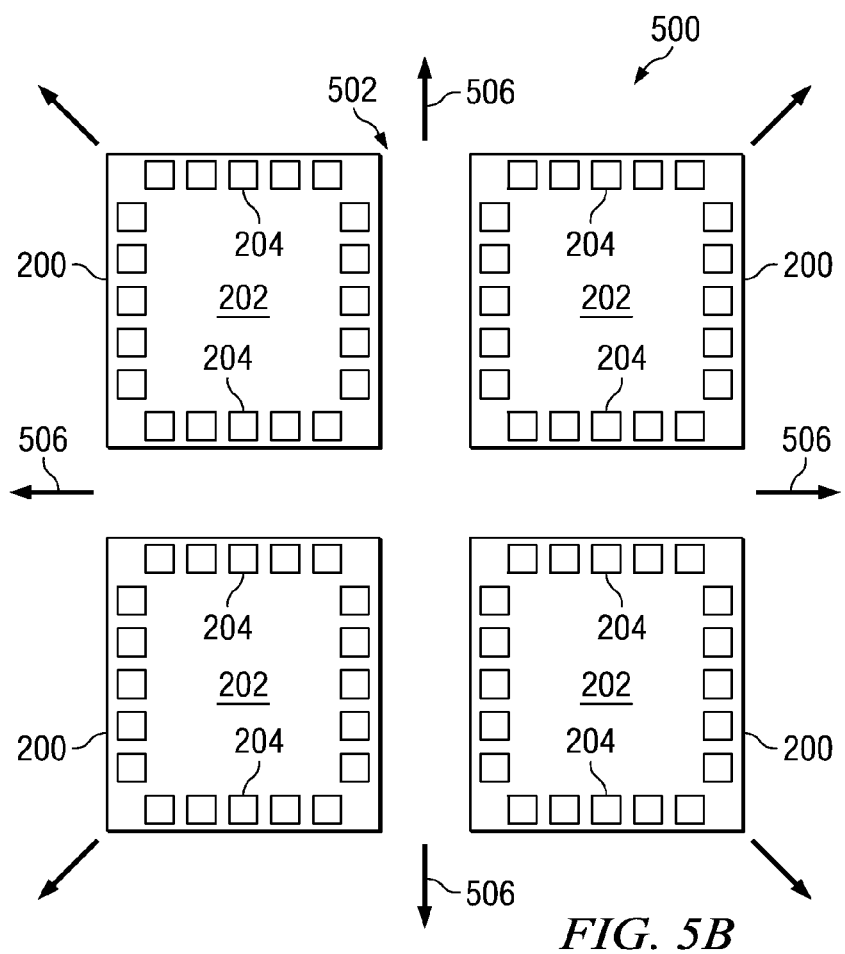

FIGS. 5A and 5B illustrate a third step in the first exemplary method of manufacturing the THV stackable semiconductor device as shown in FIGS. 2A and 2B in a side and top view, respectively. Wafer 300, in the depicted respective segments, undergoes an expansion process. The dicing tape 404 can be stretched by using an expansion table to render a series of gaps 502 having predetermined distances 504. The depicted arrows 506 indicate the various expansion directions undergone by the wafer expansion process.

Figure 6A:
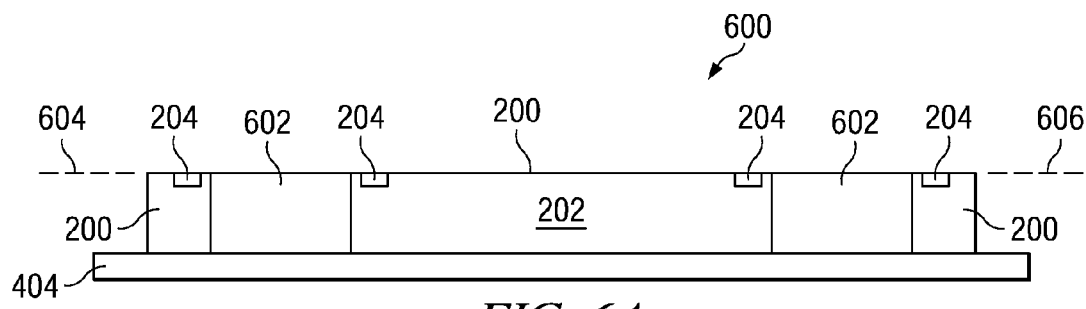
FIGS. 6A and 6B illustrate a fourth step in a first exemplary method of manufacturing the THV stackable semiconductor device as shown in FIGS. 2A and 2B in a side and top view, respectively.
Figure 6B:
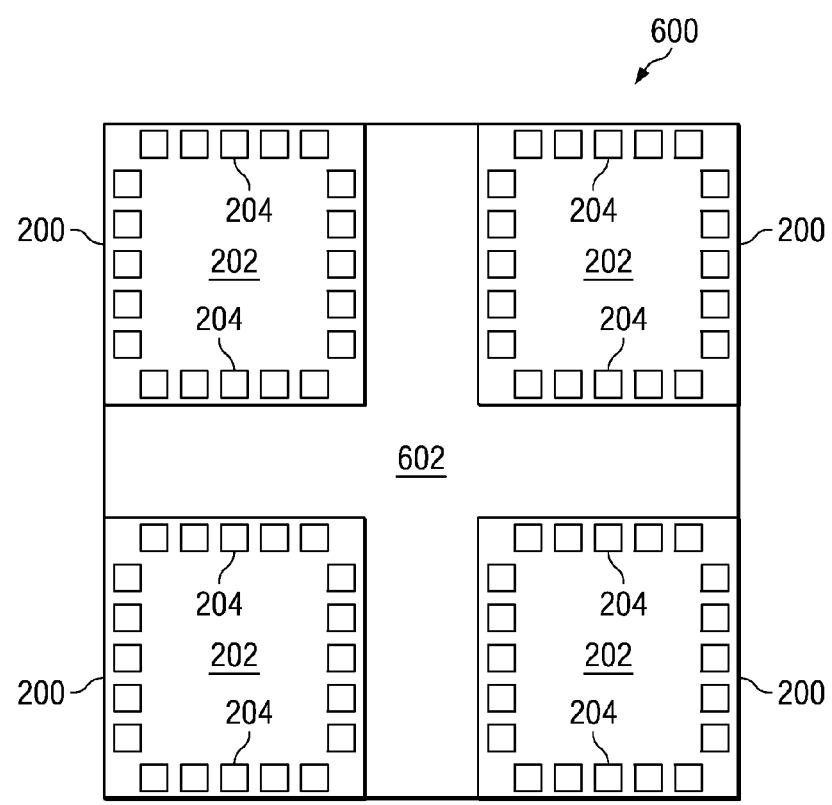

As a next step, FIGS. 6A and 6B illustrate a fourth step in the first exemplary method of manufacturing the THV stackable semiconductor device as shown in FIGS. 2A and 2B in a side and top view, respectively. The various gaps 502 shown in FIGS. 5A and 5B are filled with the previously described organic material 602. A plane 604 corresponding to a top surface of filled segments 600 is substantially coplanar with a plane 606 corresponding to a top surface of organic material 602.

The organic material 602 application can be performed by such methods as spin-coating, needle dispensing, or similar application.

Figure 7A:
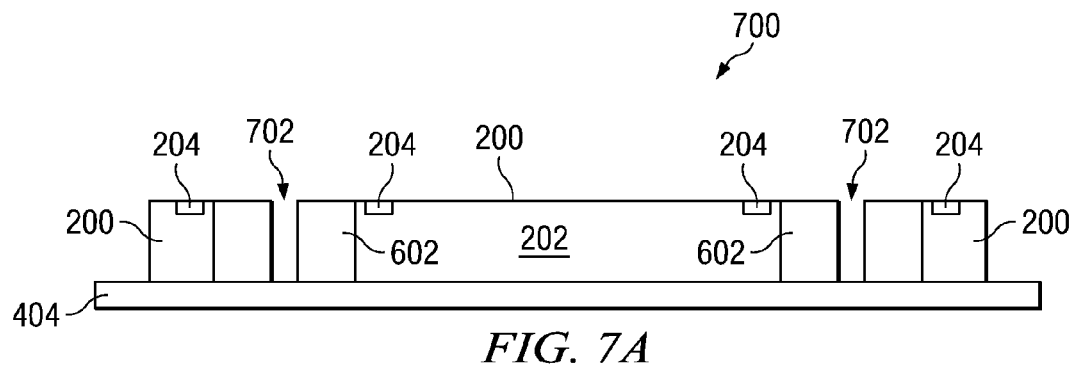
FIGS. 7A and 7B illustrate a fifth step in a first exemplary method of manufacturing the THV stackable semiconductor device as shown in FIGS. 2A and 2B in a side and top view, respectively.
Figure 7B:
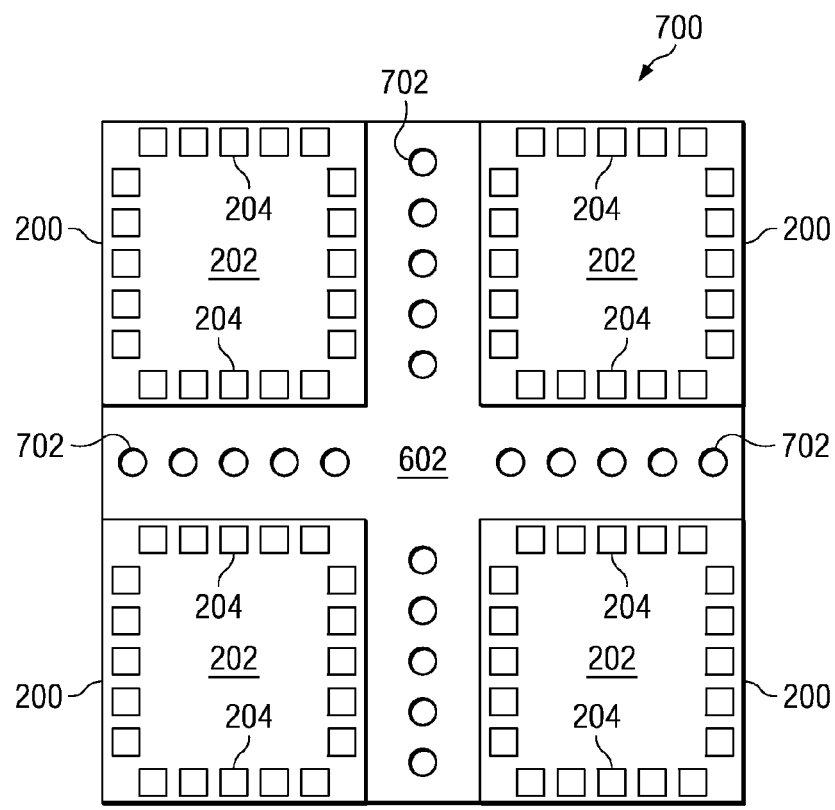

FIGS. 7A and 7B illustrate a fifth step in the first exemplary method of manufacturing the THV stackable semiconductor device as shown in FIGS. 2A and 2B in a side and top view, respectively. Segments 700 undergo a process to form a plurality of via holes 702 in organic material 602 as shown. The via holes can be formed in various processes, including a laser via drilling process or an etching process. As is shown, each of the via holes is configured in organic material 602 to correspond to respective bump pad 204 to which the via hole will be associated.

Figure 8A:
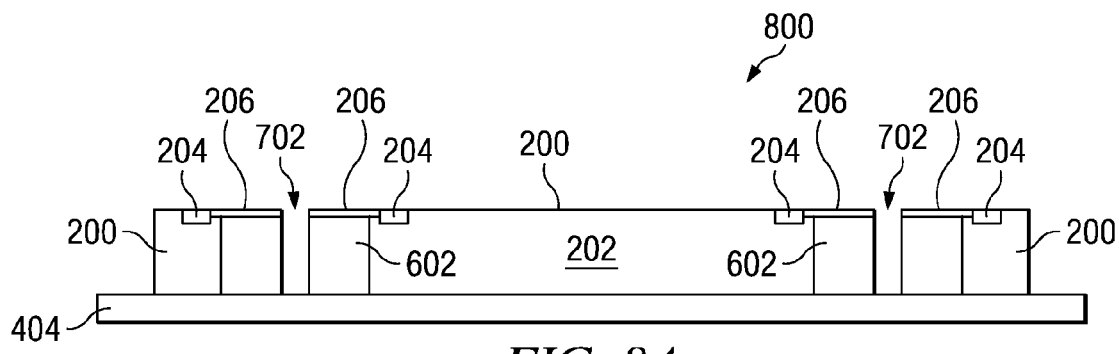
FIGS. 8A and 8B illustrate a sixth step in a first exemplary method of manufacturing the THV stackable semiconductor device as shown in FIGS. 2A and 2B in a side and top view, respectively.
Figure 8B:
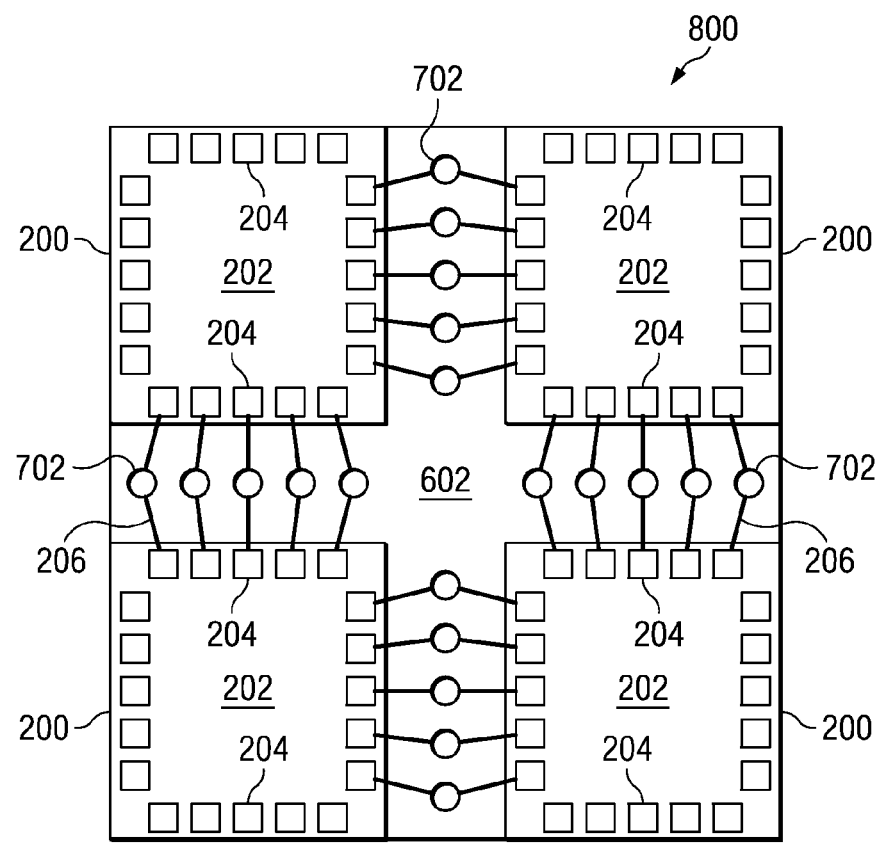

Turning to FIGS. 8A and 8B, a sixth step in the first exemplary method of manufacturing the THV stackable semiconductor device as shown in FIGS. 2A and 2B in a side and top view, respectively, is shown. FIGS. 8A and 8B illustrate a metal patterning process, which connects a series of metal traces 206 from bond pads 204 to via holes 702. Metal traces 206 electrically connect the bond pads to each of via holes 702 locations as shown.

Figure 9A:
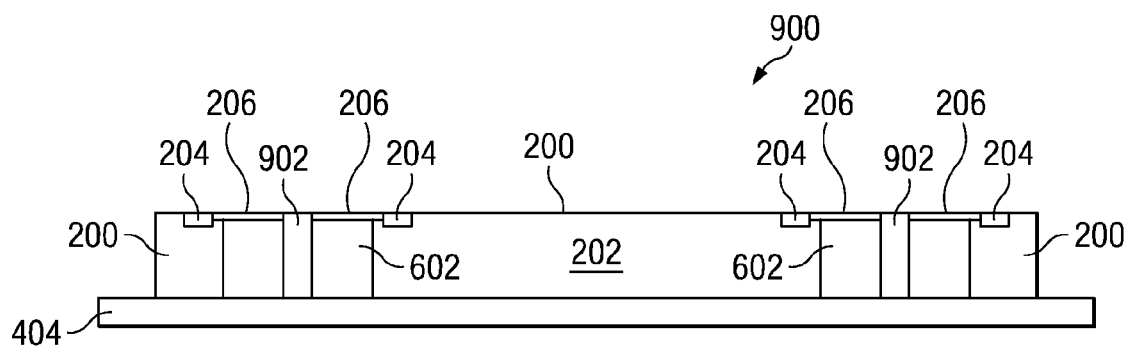
FIGS. 9A and 9B illustrate a seventh step in a first exemplary method of manufacturing the THV stackable semiconductor device as shown in FIGS. 2A and 2B in a side and top view, respectively.
Figure 9B:
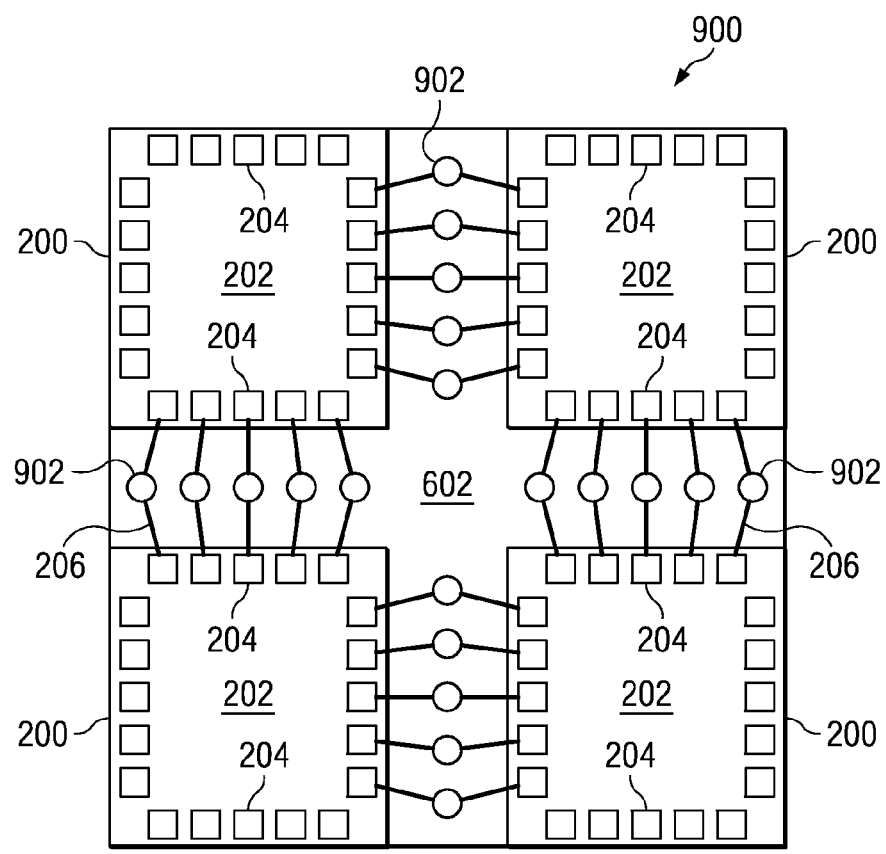

FIGS. 9A and 9B illustrate a seventh step in the first exemplary method of manufacturing the THV stackable semiconductor device as shown in FIGS. 2A and 2B. A via hole metal deposition process is performed to assembly 900 to deposit conductive material into each of via holes 702, forming a series of metal vias 902. The conductive material can be materials such as Al, copper (Cu), tungsten (W), combination of metal alloys, or any other conductive metal. Again, metal vias 902 are formed in organic material 602. A variety of methods and techniques can be used to form the metal vias, such as a plating or plugging process.

Figure 10A:
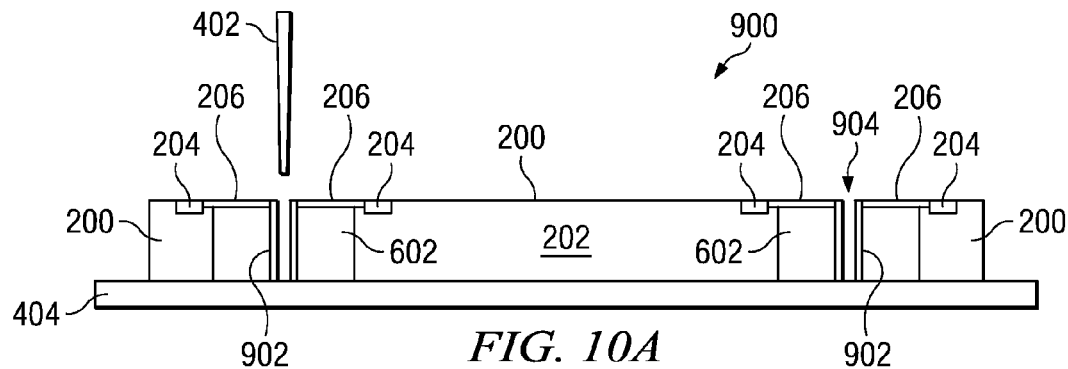
FIGS. 10A and 10B illustrate an eighth step in a first exemplary method of manufacturing the THV stackable semiconductor device as shown in FIGS. 2A and 2B in a side and top view, respectively.
Figure 10B:
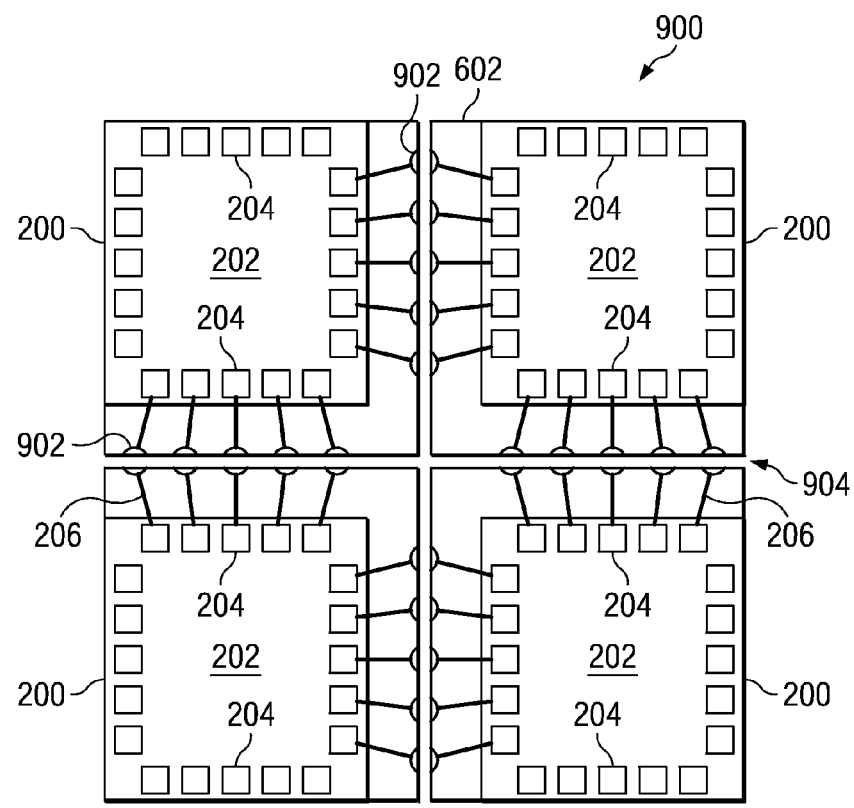

FIGS. 10A and 10B illustrate an eighth step in the first exemplary method of manufacturing the THV stackable semiconductor device as shown in FIGS. 2A and 2B. Wafer assembly 300, and 900 is singulated for a second time by a cutting tool 402 to form gaps 904. The various dies 202 shown in FIGS. 10A, 10B, and the preceding exemplary figures represent a smaller portion of a totality of semiconductor devices, which are yielded from a particular wafer 300. As such, following the conclusion of the second singulation step, a majority of dies 202 are rendered to be like the embodiment shown in FIGS. 2A and 2B, where organic material 210 completely surrounds the peripheral surface of die 202, and THVs 902 are configured in rows along each side surface of the die as previously represented.

In one embodiment, following the singulation step depicted in FIGS. 10A and 10B, individual dies 202 are removed by a die pick and place process to remove each die 202 from dicing tape 404.

Figure 11A:
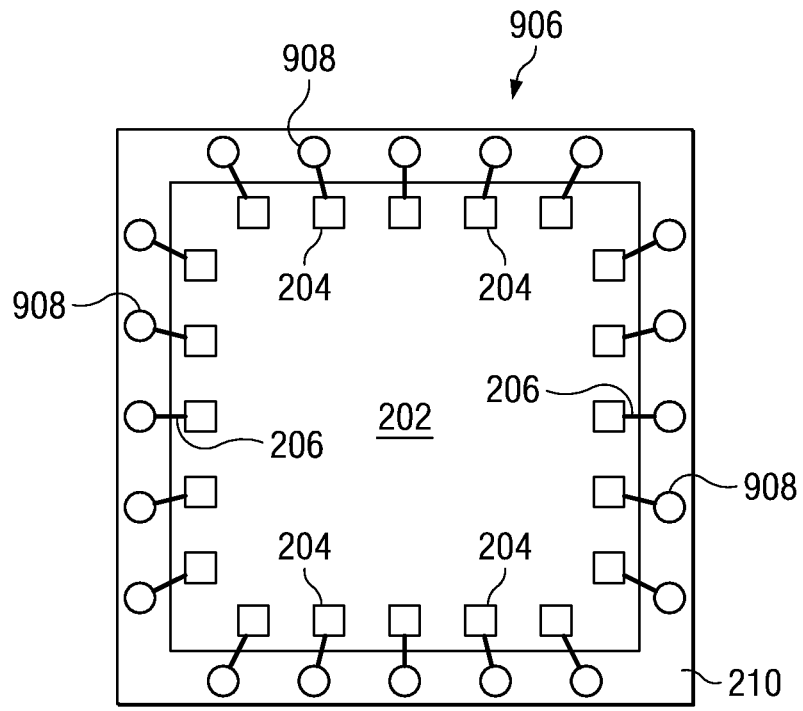
FIGS. 11A and 11B illustrate a second embodiment of a THV stackable semiconductor device incorporating a plurality of complete THVs, as shown in a top and side view, respectively.
Figure 11B:
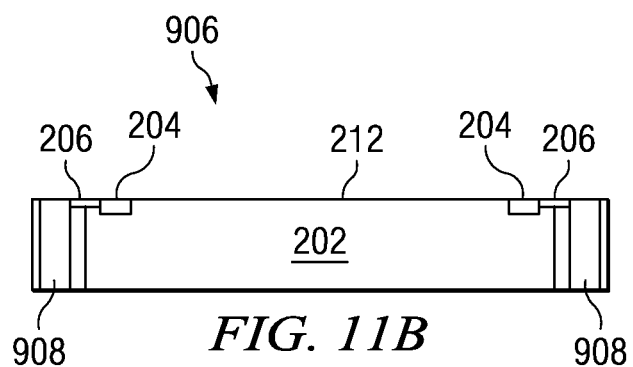

FIGS. 11A and 11B illustrate a second embodiment of a THV stackable semiconductor device 906 incorporating a plurality of complete THVs, as shown in a top and side view, respectively. The various features shown in the previous figures are shown, including die 202, bond pads 204, and metal tracings, which are formed on the active surface 212 of die 202. In the instant embodiment 906, the respective THVs 908 are complete, in lieu of being half-cut as shown in the previous embodiment. The depicted complete THVs 908 can be formed by a particular configuration of saw street guide 302 as shown in FIGS. 3A and 3B. A wider saw street guide 302 allows organic material 602 to be cut as shown, retaining a complete via hole 908.

Figure 12A:
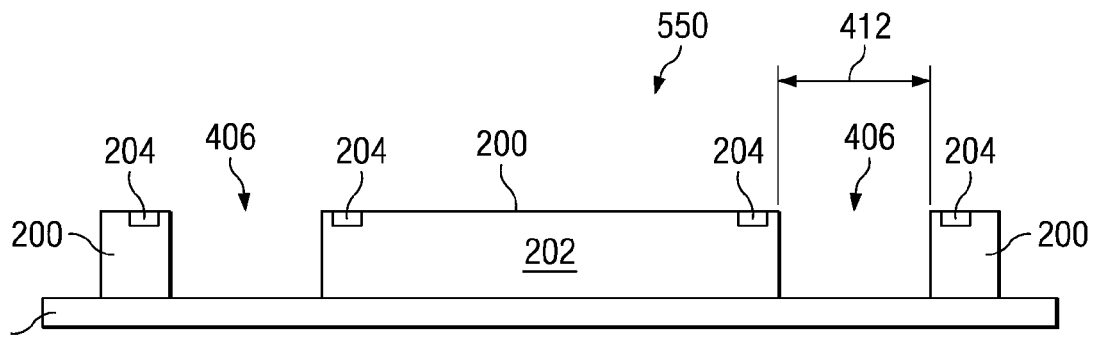
FIGS. 12A and 12B illustrate a third step in a second exemplary method of manufacturing the THV stackable semiconductor device as shown in FIGS. 2A and 2B in a side and top view, respectively.
Figure 12B:
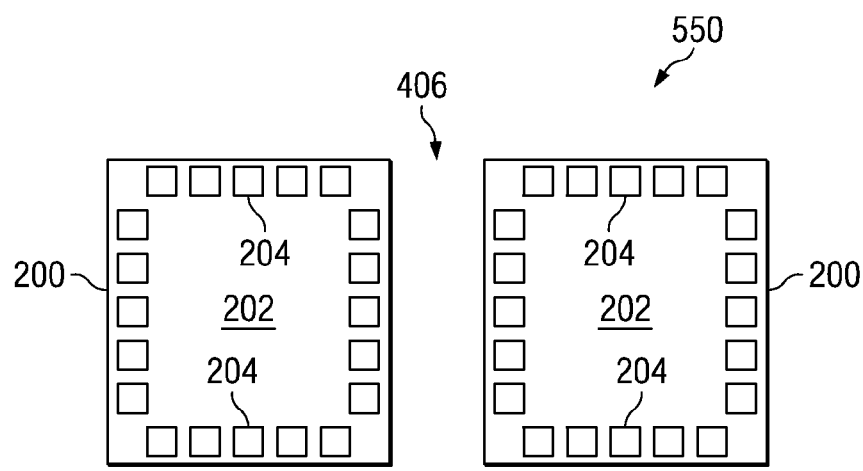
Figure 12B:
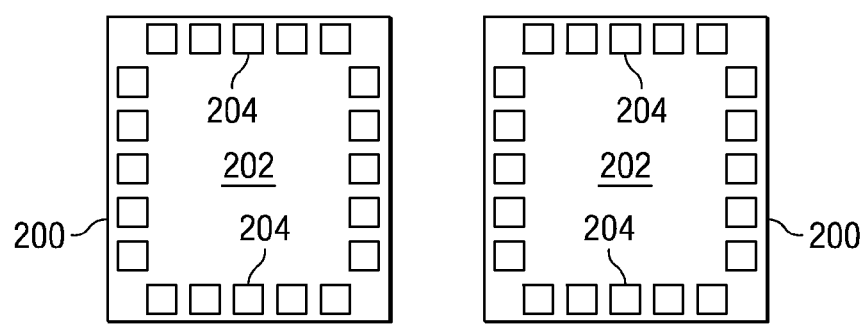

FIGS. 12A and 12B illustrate a third step in a second exemplary method of manufacturing the THV stackable semiconductor device as shown in FIGS. 2A and 2B in a side and top view, respectively. The second method of manufacture as described shares the first two steps, i.e., providing a wafer and singulation into respective segments upon dicing tape 404, as the first exemplary method previously described. In addition, various features such as bond pads 204 are again shown.

As a next step, wafer segments 550 are picked from dicing tape 404 and placed onto a wafer support system 405 as shown. The wafer support system can logically include a second dicing tape 405. However, the wafer support system can also be a temporary wafer support system, such as glass, ceramic, laminate, or silicon (Si) substrate. In one embodiment, sawn dies 202 are picked from dicing tape 404 and placed onto wafer support system 405 using pick and place machines. The pick and place process renders a gap 406 having a predetermined width or distance 412 between respective segments 550.

Figure 13A:
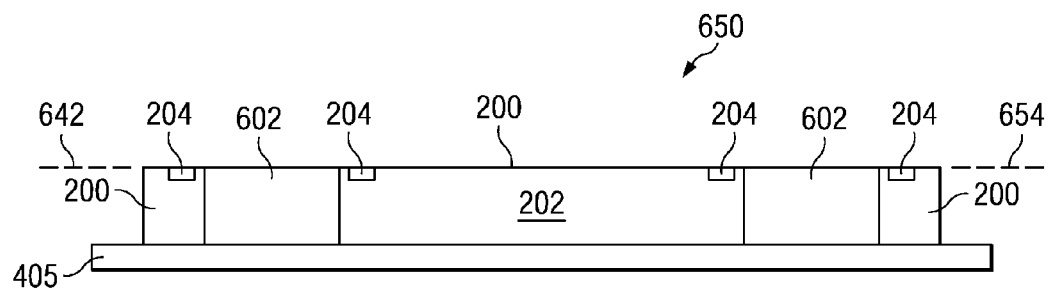
FIGS. 13A and 13B illustrate a fourth step in a second exemplary method of manufacturing the THV stackable semiconductor device as shown in FIGS. 2A and 2B in a side and top view, respectively.
Figure 13B:
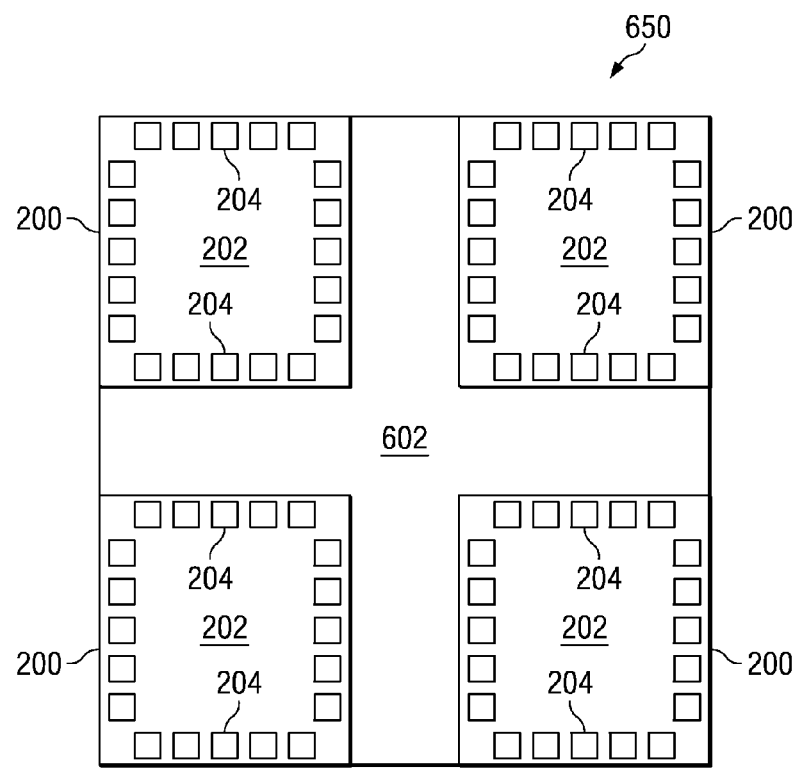

FIGS. 13A and 13B illustrate a fourth step in the second exemplary method of manufacturing the THV stackable semiconductor device as shown in FIGS. 2A and 2B. The organic material 602 is again applied to segments 650 in a similar spin-coating, needle dispensing, or other manner as previously described. Plane 642 of segments 650 is substantially coplanar with plane 654 of organic material 602.

Figure 14A:
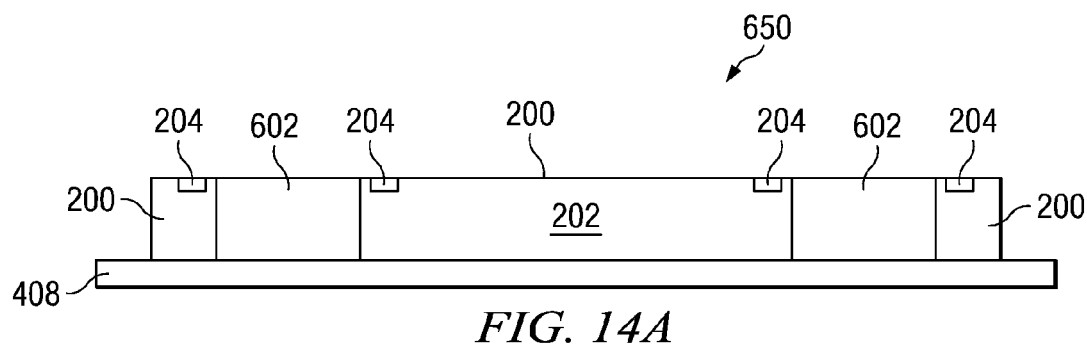
FIGS. 14A and 14B illustrate a fifth step in a second exemplary method of manufacturing the THV stackable semiconductor device as shown in FIGS. 2A and 2B in a side and top view, respectively.
Figure 14B:
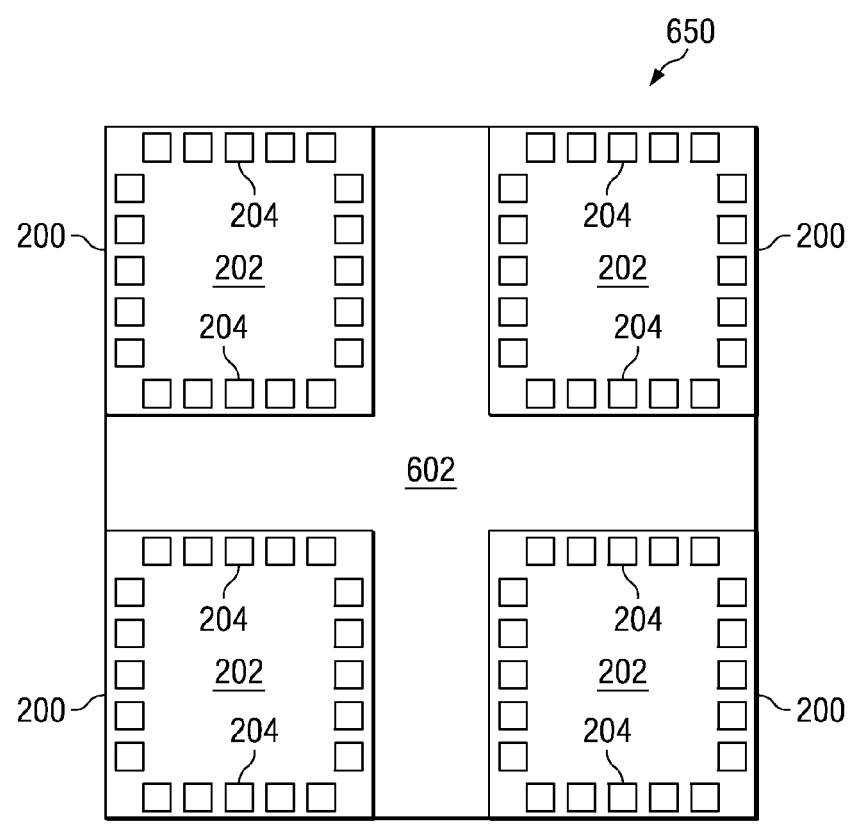

Turning to FIGS. 14A and 14B, a fifth step in the second exemplary method of manufacturing the THV stackable semiconductor device is shown in FIGS. 2A and 2B. The recoated wafer 300 is transferred onto a second wafer support system 408. The second wafer support system can again include glass, Si substrate materials, ceramic, and laminate materials.

Figure 15A:
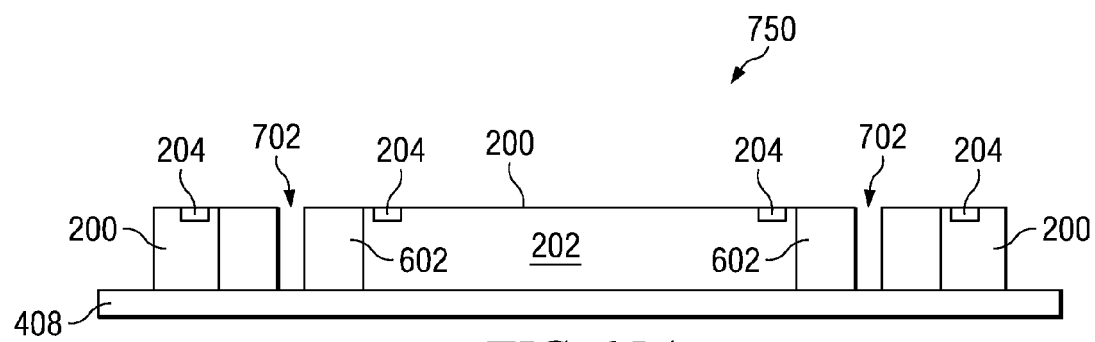
FIGS. 15A and 15B illustrate a sixth step in a second exemplary method of manufacturing the THV stackable semiconductor device as shown in FIGS. 2A and 2B in a side and top view, respectively.
Figure 15B:
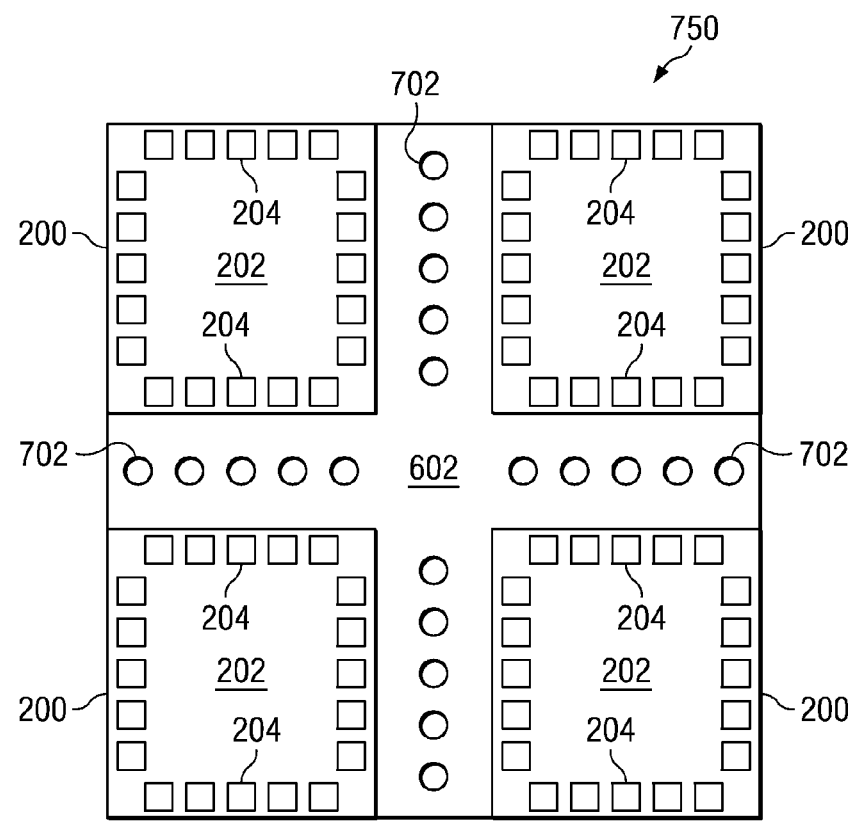

FIGS. 15A and 15B illustrate a sixth step in the second exemplary method of manufacturing the THV stackable semiconductor device as shown in FIGS. 2A and 2B in a side and top view, respectively. In a step 750, similar to that shown in FIGS. 7A and 7B, a plurality of via holes 702 is formed in organic material 602 to coincide with bond pads 204.

Figure 16A:
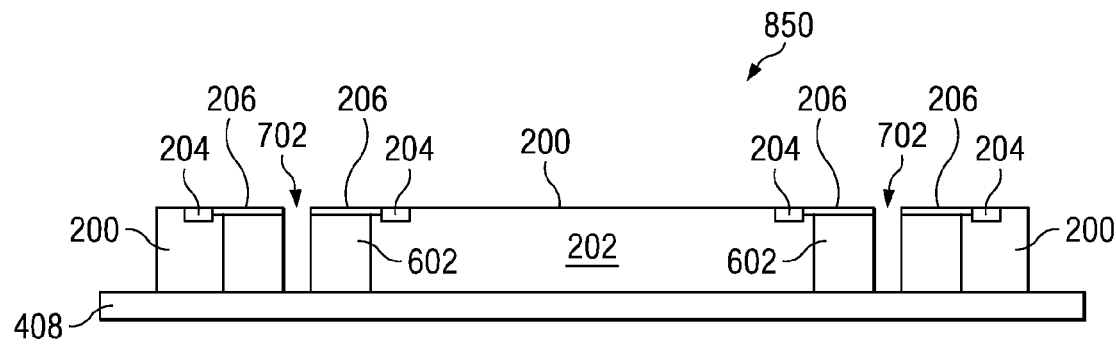
FIGS. 16A and 16B illustrate a seventh step in a second exemplary method of manufacturing the THV stackable semiconductor device as shown in FIGS. 2A and 2B in a side and top view, respectively.
Figure 16B:
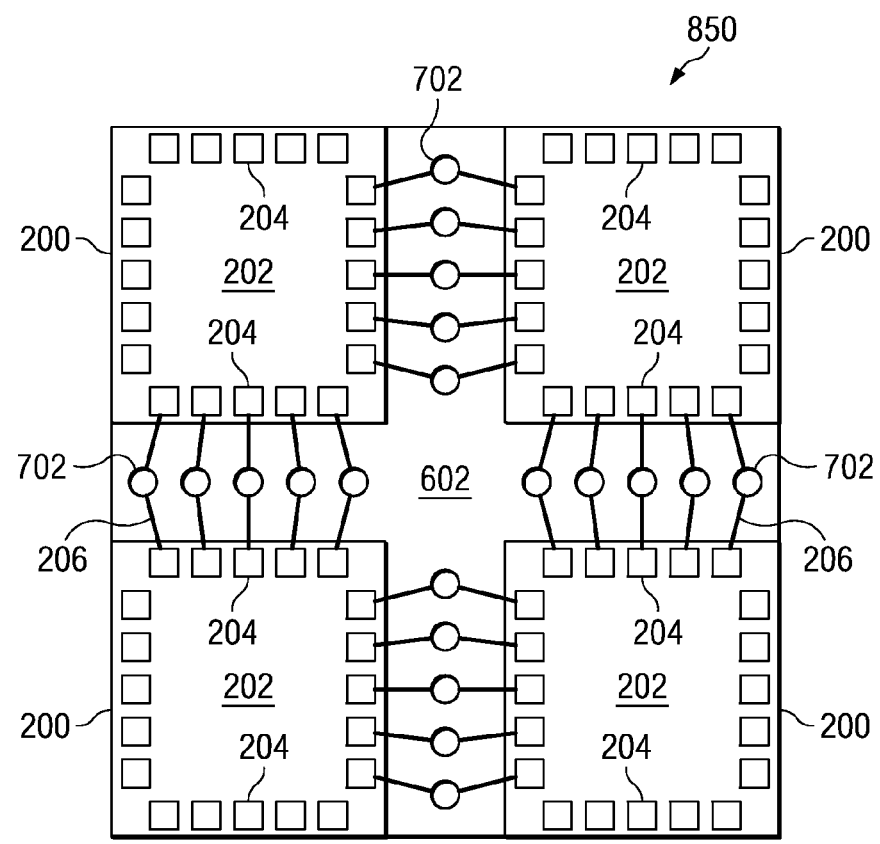

FIGS. 16A and 16B illustrate a seventh step 850 in the second exemplary method of manufacturing the THV stackable semiconductor device as shown in FIGS. 2A and 2B in a side and top view, respectively. Step 850 is again similar to that shown in FIGS. 8A and 8B of metal patterning of metal traces 206 to electrically couple bond pad 204 locations to via 702 locations.

Figure 17A:
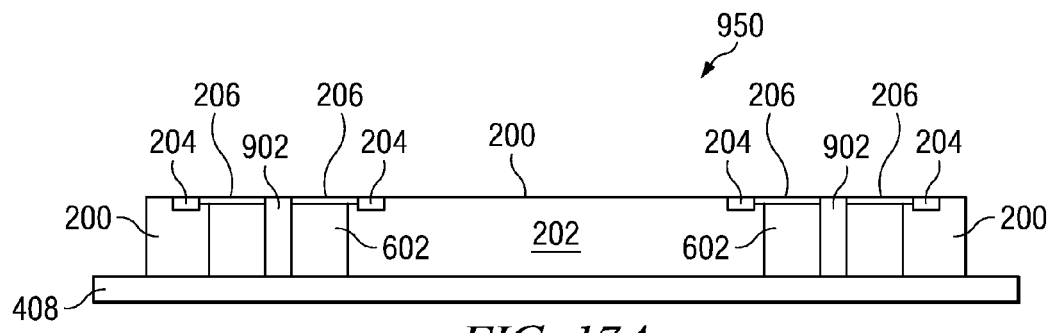
FIGS. 17A and 17B illustrate an eighth step in a second exemplary method of manufacturing the THV stackable semiconductor device as shown in FIGS. 2A and 2B in a side and top view, respectively.
Figure 17B:
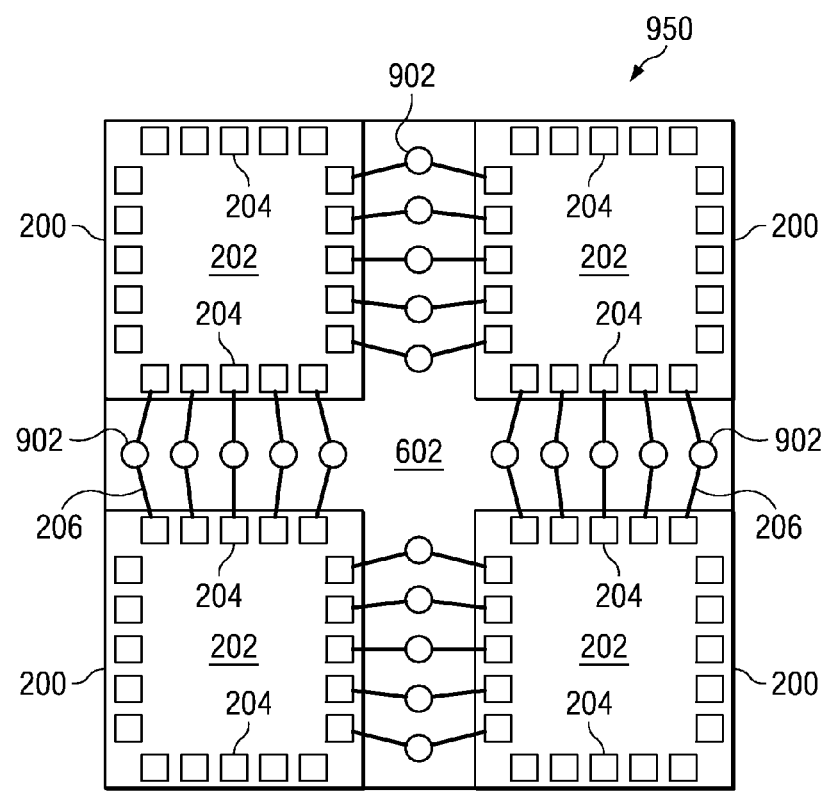

FIGS. 17A and 17B illustrate an eighth step 950 in the second exemplary method of manufacturing the THV stackable semiconductor device as shown in FIGS. 2A and 2B. Vias 702 are plugged, plated or otherwise deposited with a conductive material to fill via holes 702 and render metal vias 902 as shown.

Figure 18A:
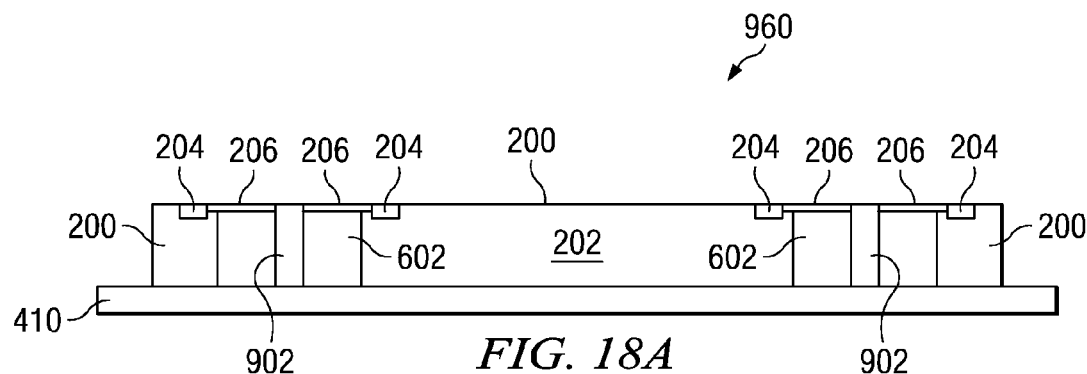
FIGS. 18A and 18B illustrate a ninth step in a second exemplary method of manufacturing the THV stackable semiconductor device as shown in FIGS. 2A and 2B in a side and top view, respectively.
Figure 18B:
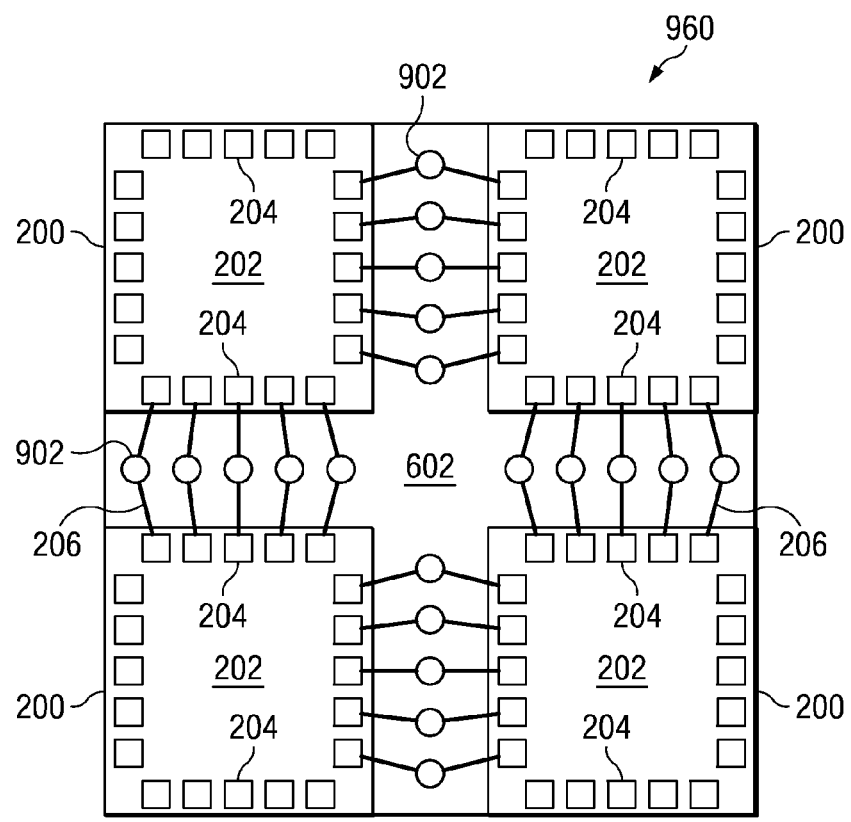

Following the metal via 902 formation process, via hole wafer 960 is transferred onto an additional dicing tape 410 as shown in FIGS. 18A and 18B, which illustrates the depicted ninth step.

Figure 19A:
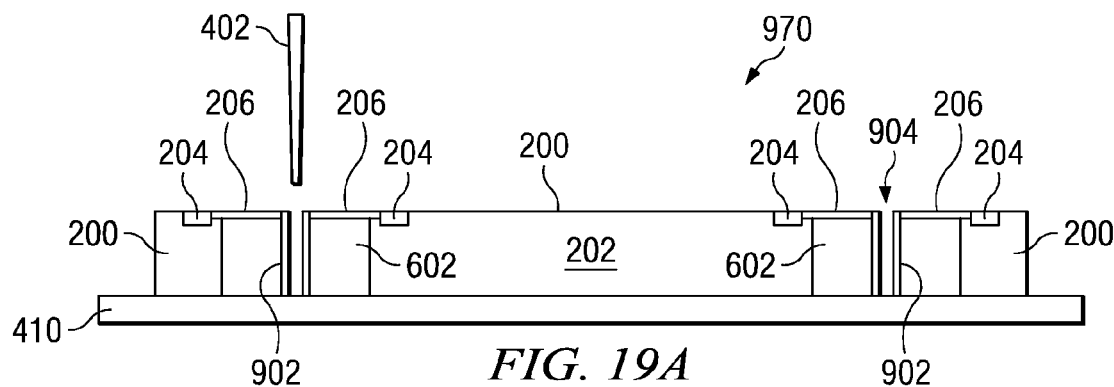
FIGS. 19A and 19B illustrate a tenth step in a second exemplary method of manufacturing the THV stackable semiconductor device as shown in FIGS. 2A and 2B in a side and top view, respectively.
Figure 19B:
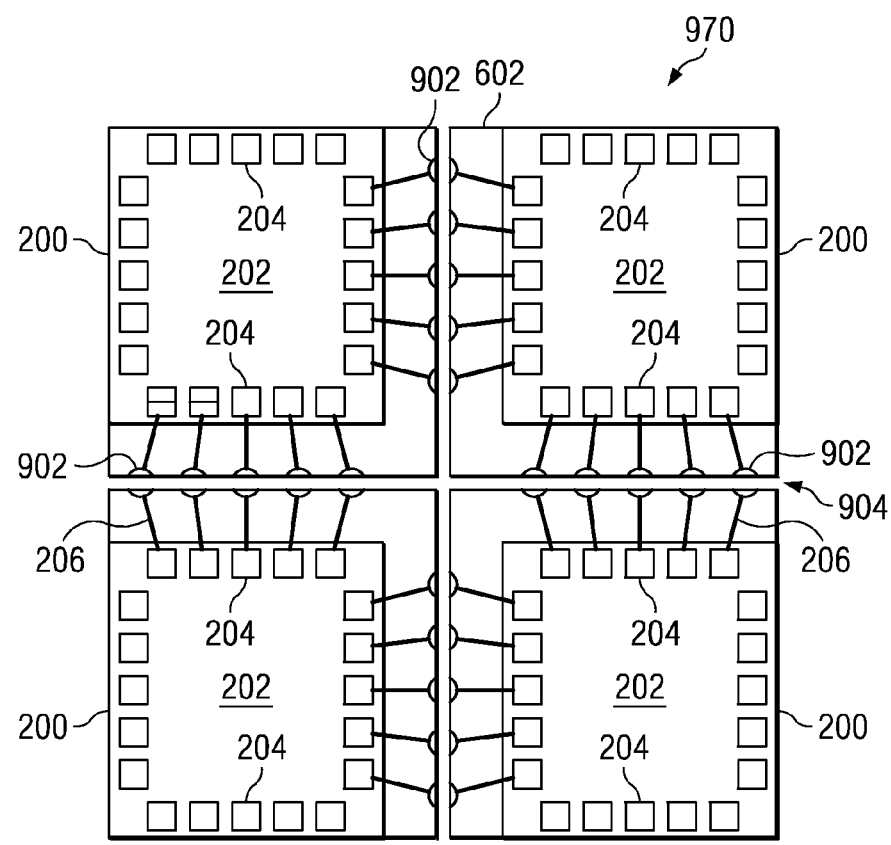

FIGS. 19A and 19B illustrate a tenth step in the second exemplary method of manufacturing the THV stackable semiconductor device as shown in FIGS. 2A and 2B. A cutting tool 402 is again used to singulate via hole wafer 960 into the depicted segments 970, resulting in gaps 904. As a final step, following the second singulation process, a die pick and place machine can be utilized to again remove each device 200 from dicing tape 410.

Figure 20:
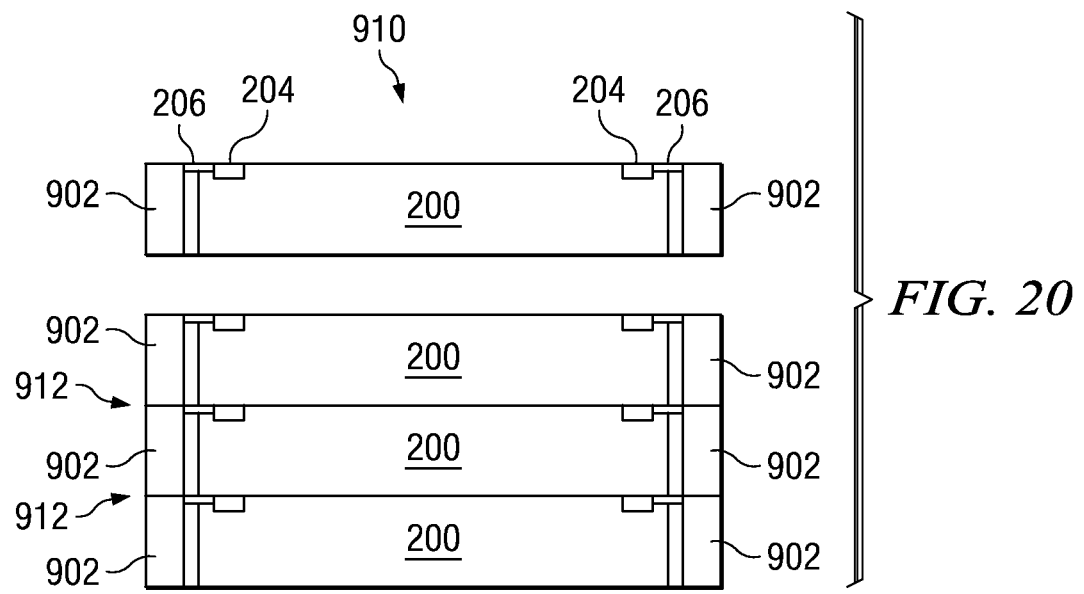
FIG. 20 illustrates a third exemplary embodiment of a THV stackable semiconductor device, shown utilizing a die-to-die stacking configuration in a side view.

FIG. 20 illustrates a third exemplary embodiment of THV stackable semiconductor devices 910, shown utilizing a die-to-die stacking configuration in a side view. A series of devices 200 can be stacked as shown to suit a particular application. Each of the metal vias 902 can be joined together as shown by union 912 using a direct via metal bonding process. Any number of devices 200 can be stacked as shown to realize a desired implementation.

Figure 21:
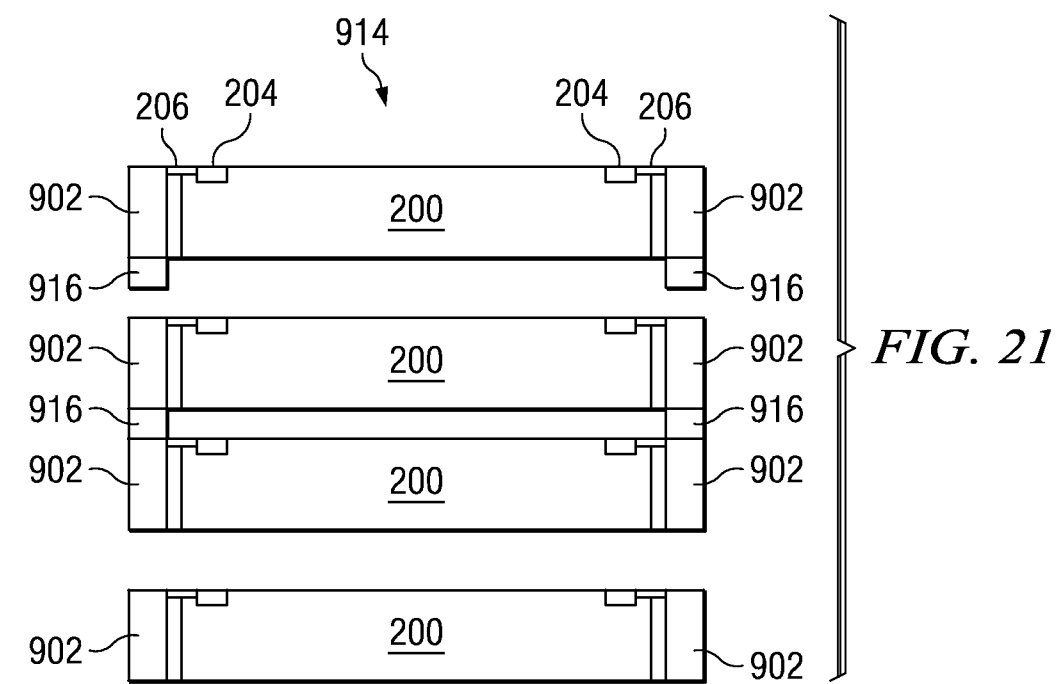
FIG. 21 illustrates a fourth exemplary embodiment of a THV stackable semiconductor device, shown utilizing a die-to-die stacking configuration which incorporates solder paste, again in a side view.

FIG. 21 illustrates a fourth exemplary embodiment of THV stackable semiconductor devices, shown utilizing a die-to-die stacking configuration which incorporates solder paste 916, again in a side view. Solder paste 916 includes a mix of small solder particles and flux. A variety of solder pastes of various materials can be incorporated. Solder paste 916 can be applied using a reflow soldering method to create a strong metallurgical bond between each of stacked devices 914.

Figure 22:
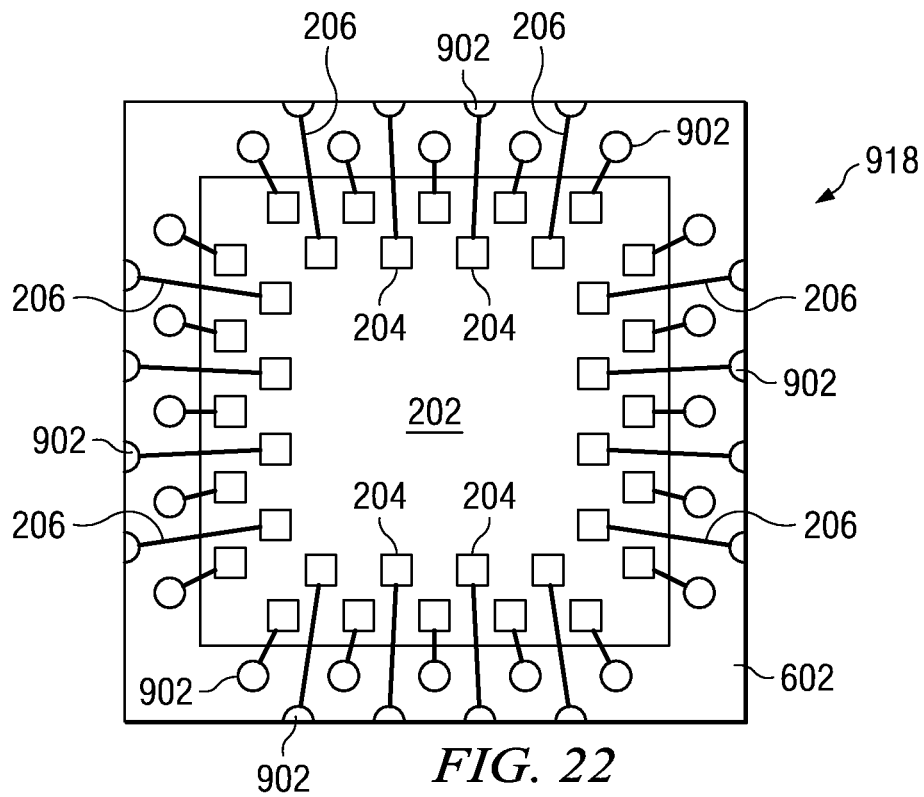
FIG. 22 illustrates a fifth exemplary embodiment of a THV stackable semiconductor device, having multiple rows of bond pads and multiple rows of via holes as shown in a top view.

A fifth exemplary embodiment of a THV stackable semiconductor device 918 is shown in FIG. 22. The present embodiment includes multiple rows of bond pads 204 and multiple rows of via holes 902 as shown in a top view, which are appropriately connected with metal tracings 206. Each of the via holes 902 are disposed in organic material 602 as shown. Any number of configurations of dies 202 having multiple rows of bond pads 204 and multiple rows of via holes 902 can be implemented. In addition to the present embodiment 918, another embodiment can be realized which connects the depicted half-cut outer vias 902 to bond pads 204 which are not located on the active surface of die 202, but on an additional surface, such as an additional die 202 or elsewhere as a specific implementation requires.

Figure 23:
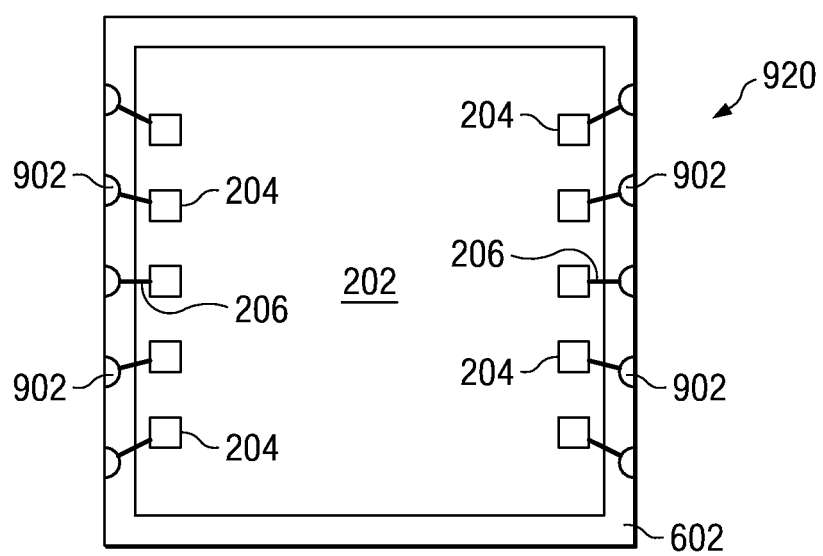
FIG. 23 illustrates a sixth exemplary embodiment of a THV stackable semiconductor device, incorporating a row of half-cut via holes coupled to a row of bond pads on opposing sides of a die as shown in a top view.

A sixth exemplary embodiment of a THV stackable semiconductor device 920 is shown in FIG. 23. Device 920 illustrates an additional configuration of bond pads 204, traces 206, and a series of half-cut vias 902, which are disposed on opposing sides of die 202. The dies 902 are formed in organic material 602, which is disposed on each peripheral side of die 202 as shown. In a variation of the depicted embodiment 920, a configuration can include complete vias 902.

Figure 24:
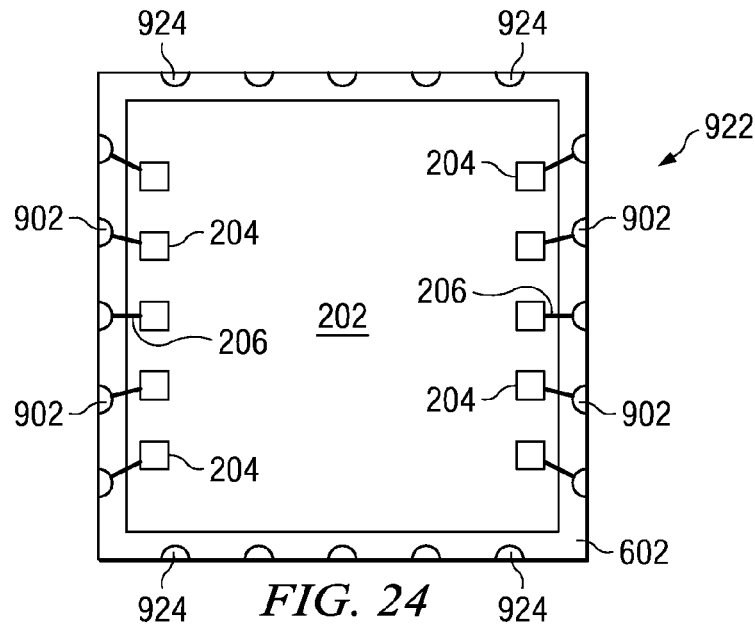
FIG. 24 illustrates a seventh exemplary embodiment of a THV stackable semiconductor device, incorporating dummy via holes on opposing sides as shown in a top view.

A seventh exemplary embodiment of a THV stackable semiconductor device 922 is depicted in FIG. 24. Device 922 includes a series of dummy via holes 924 which are disposed on opposing sides of die 202 as shown. Vias 902 are disposed on the left and right hand side as shown. Dummy via holes 924 can provide for electrical connectivity through device 922 for specific applications. Dummy via holes 924 can be used to connect an additional device 922 or package using a wire-bonding process. In addition, holes 924 can act as a ground or as a conduit for input/output (I/O) signals.

Figure 25:
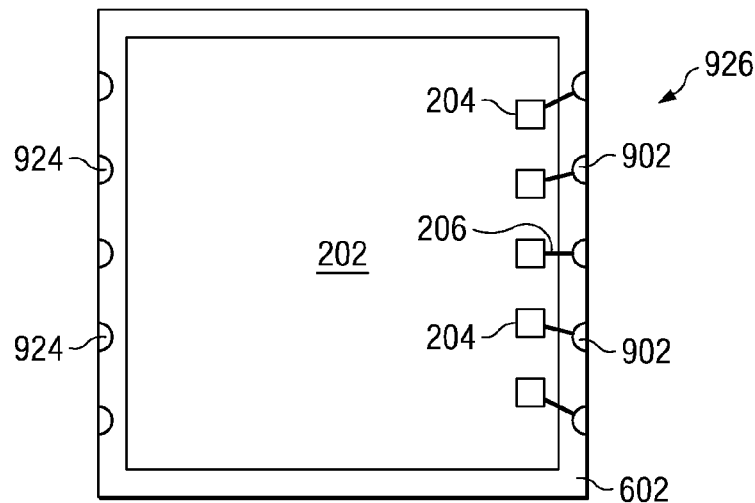
FIG. 25 illustrates an eighth exemplary embodiment of a THV stackable semiconductor device, incorporating dummy via holes on a single side as shown in a top view.

Dummy holes 924 can be configured, as with vias 902, in a variety of implementations. For example, multiple rows, or full or half-cut holes 924 can be implemented. FIG. 25 illustrates one such embodiment of a device 926, which includes a row of half-cut dummy vias 924 on the left side of die 202, and a row of THVs 902, on the right side of die 202, again disposed in organic material 602.

Figure 26:
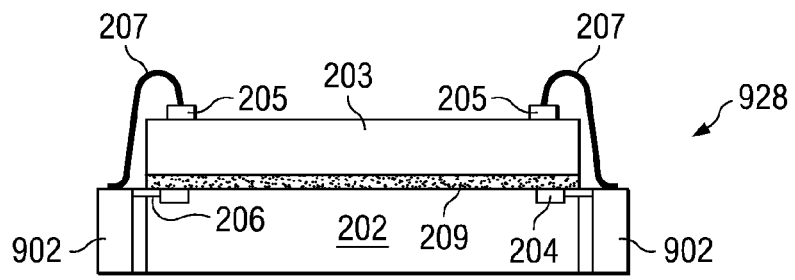
FIG. 26 illustrates a ninth exemplary embodiment of a THV stackable semiconductor device, depicting two stacked dies utilizing the dummy via holes as shown in FIGS. 24 and 25 to connect a top die with a wire-bonding process.

FIG. 26 illustrates a ninth exemplary embodiment of a THV stackable semiconductor device 928, depicting two stacked dies 202 and 203 utilizing dummy via holes 902 as shown in FIGS. 24 and 25 to connect a top die 203 with a wire-bonding process. A series of bond pads 205 is disposed on an active surface of die 203. Wire-bonds 207 connect bond pads 205 to vias 902. A dielectric, insulating or bonding material 209 is disposed between die 202 and die 203 to provide structural support for device/package 928.

Semiconductor devices, such as device 200 incorporating a series of THVs 226 or 902 can provide a variety of functionality and flexibility in various applications. Use of organic material 210 allows placement of vias 226 outside die 202, which allows for additional circuitry within die 202 and enhancing the functionality of device 200. In addition, by using organic material 210 instead of wafer 300 material, the respective yield per wafer is increased. The organic material can be configured to be as thick as needed to accommodate a variety of vias 226 in any number of applications.

Device 200 can be incorporated into a variety of package-on-package (PoP) configurations, which make use of THV 226. Such a device can include a semiconductor die having an integrated THV 226. Such a semiconductor die can be referred to as a THV die. Current package-in-package (PiP) packaging techniques make use of wire and/or bump interconnections to provide electrical signals between dies, interposers, and packages. There is growing demand to provide more robust, efficient and space saving interconnections. The use of THV structures like 226, and thereby, THV dies to provide such interconnections can provide more robust, efficient, and space saving interconnections.

Figure 27A:
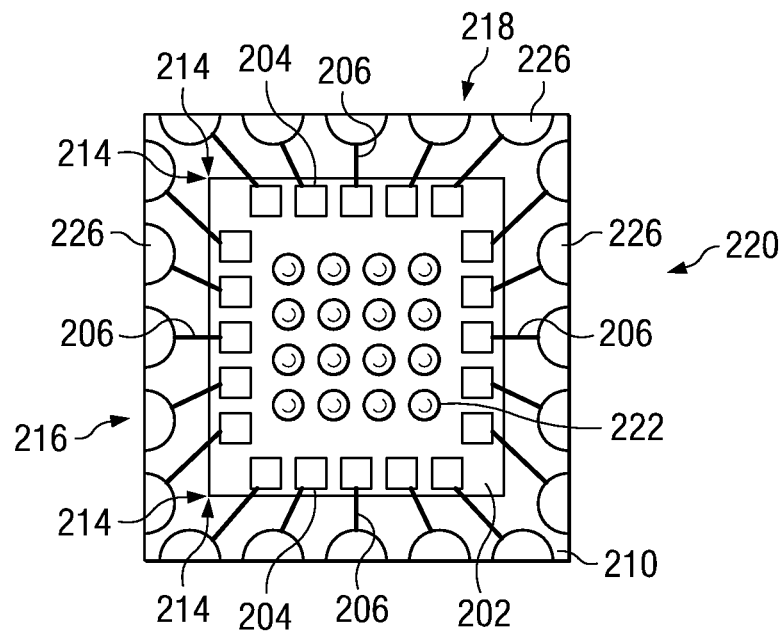
FIG. 27A illustrates a die incorporating a THV die where a series of RDL and interconnection pads are disposed over the die.

Turning to FIG. 27A, a tenth exemplary embodiment of a THV stackable semiconductor device 220 is shown. Device 220 includes die 202. An organic material 210 is disposed around peripheral surfaces 214 of die 202. The organic material is disposed along sides 218 and 216 of die 202. A bond pad 204 is formed over a top surface or integrated into a top surface of die 202. The bond pad 204 is connected to THV 226, in which a conductive material is disposed, by way of metal traces 206. A series of RDL and interconnection pads are disposed in the configuration shown above or integrated into the top surface of die 202. The RDLS and interconnection pads provide for electrical connection terminals for additional dies to be stacked over die 202.

Figure 27B:
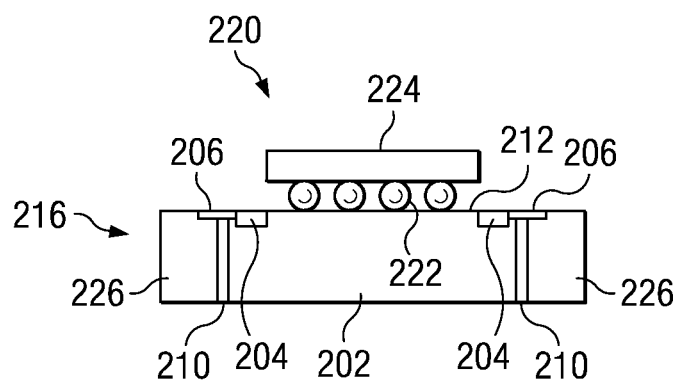
FIG. 27B illustrates the series of redistribution layers and interconnection pads connecting the THV die to a second die.

FIG. 27B illustrates a side-view representation of the THV die configuration 220, including a second semiconductor die 224 which is stacked above THV die 202. The RDLS/pads are coupled to a series of bumps 222 to electrically connect die 224. THV die 202 incorporates THV structure 226 previously described, which is integrated into organic material 210 disposed around peripheral surfaces of die 202 as shown. A series of bond pads 204 and metal traces 206 provide an electrical path to route signals through via 226 and to the top surface of Die 202.

Figure 28:
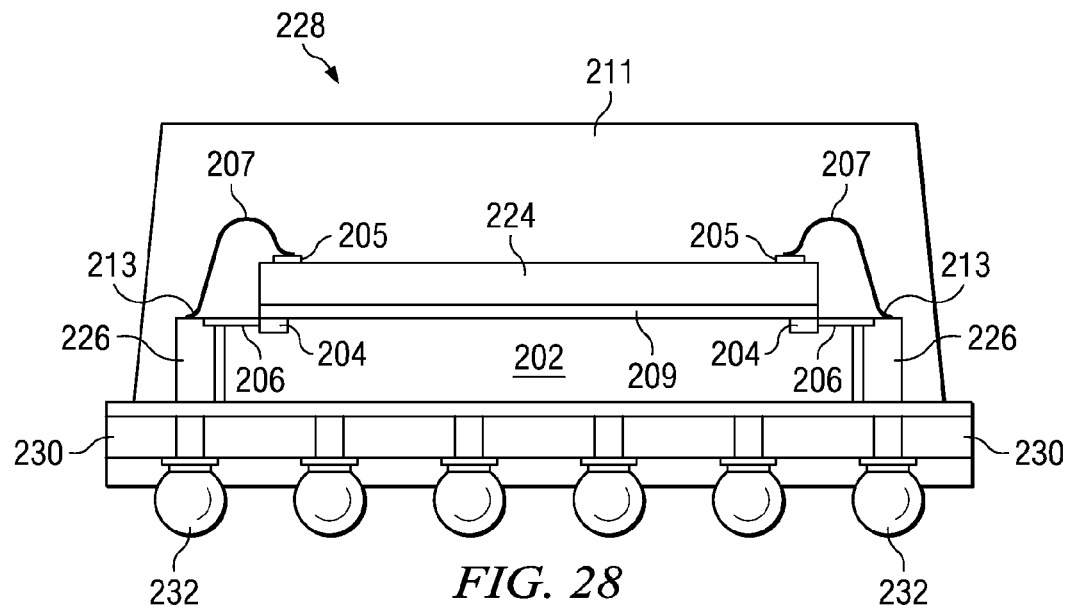
FIG. 28 illustrates a wire bond die disposed over a THV die, where the wire bond die is wire-bonded to the THV of the die.

FIG. 28 illustrates a first exemplary embodiment 228 of a series of package-in-package (PiP) configurations which make use of the THV structure. In some cases, as in the example illustrated, the package-in-package structures are formed over circuit carrier substrate 230. In addition, however, the underlying base material can include such structures as a leadframe. THV structures 226 can be used to connect a top integrated circuit, or a top integrated package using wires and/or bump interconnections. Vias 226 can act as ground or to route input/output (I/O) signals, as previously described.

Package 228 as illustrated includes die 202. An adhesive material such as a die attach (D/A) adhesive 209 couples die 202 to wire bond die 224. A bond pad 205 on wire bond die 224 uses wire 207 to couple die 224 to via 226 at terminal location 213. Wire bond die 224 and THV die 202 are disposed over substrate 230 having a series of bumps 232. An encapsulant 211 is formed over THV die 202 and wire bond die 224.

Figure 29:
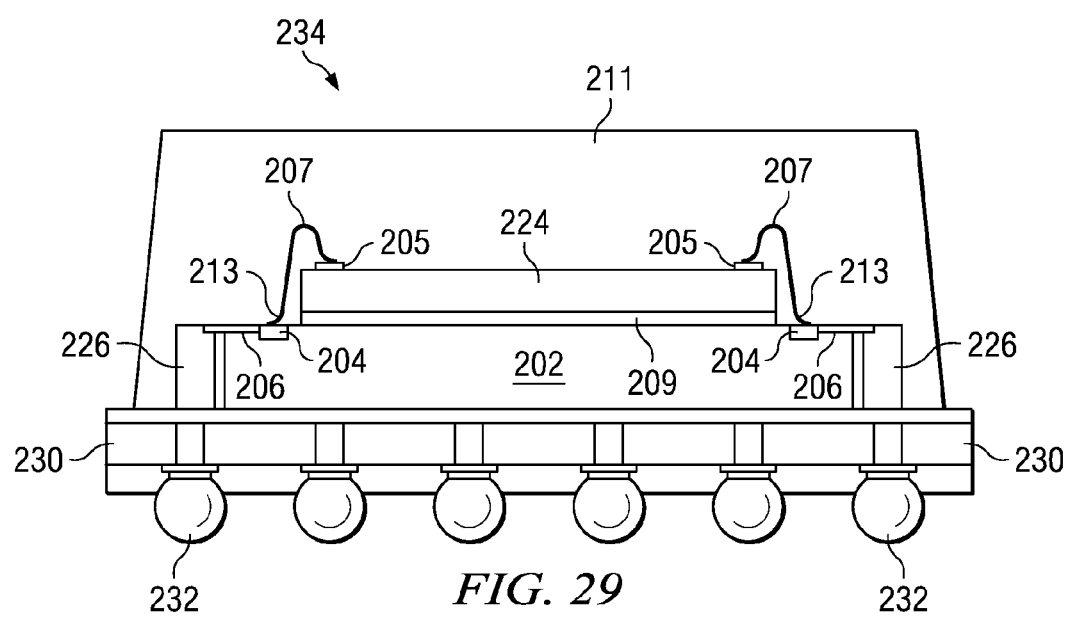
FIG. 29 illustrates a wire bond die disposed over a THV die where the wire bond die is wire-bonded to a bond pad on the THV die.

FIG. 29 illustrates an additional wire bond embodiment of package 234, where wire bond die 224 is instead wire-bonded to bond pads 204 integrated into the top surface of die 202. The bond pads 204 are coupled to via 226 using metal traces 206.

Figure 30:
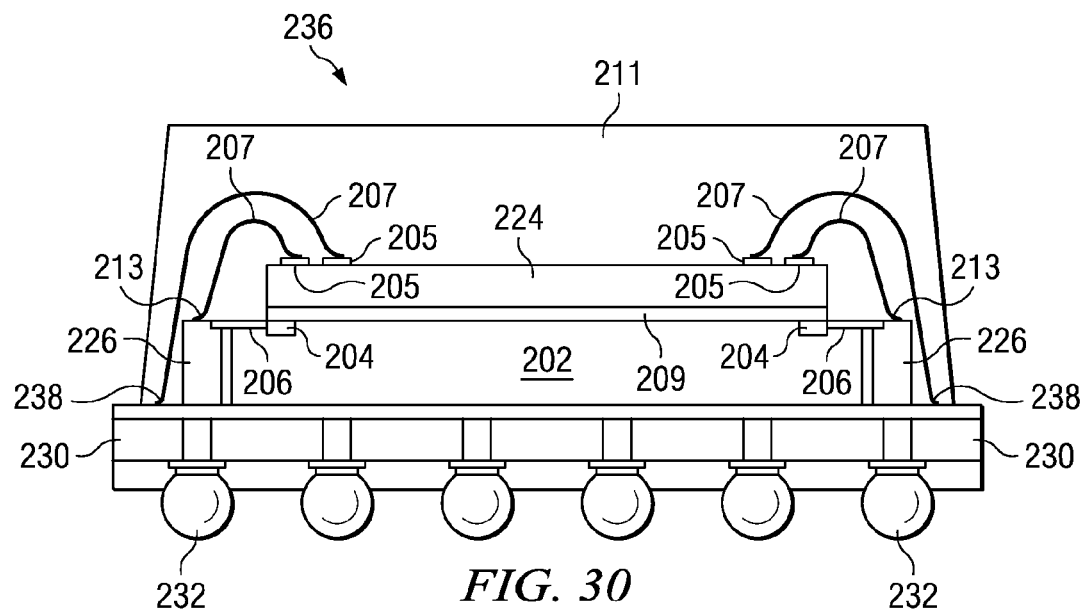
FIG. 30 illustrates a wire bond die disposed over a THV die where the wire bond die is wire-bonded to the THV of the die and a circuit carrier substrate.

In a similar embodiment, FIG. 30 illustrates a wire bond embodiment of package 236, where a series of bond pads 205 allow die 224 to be wire-bonded to both via 226 at location 213, and substrate 230 at location 238.

Figure 31:
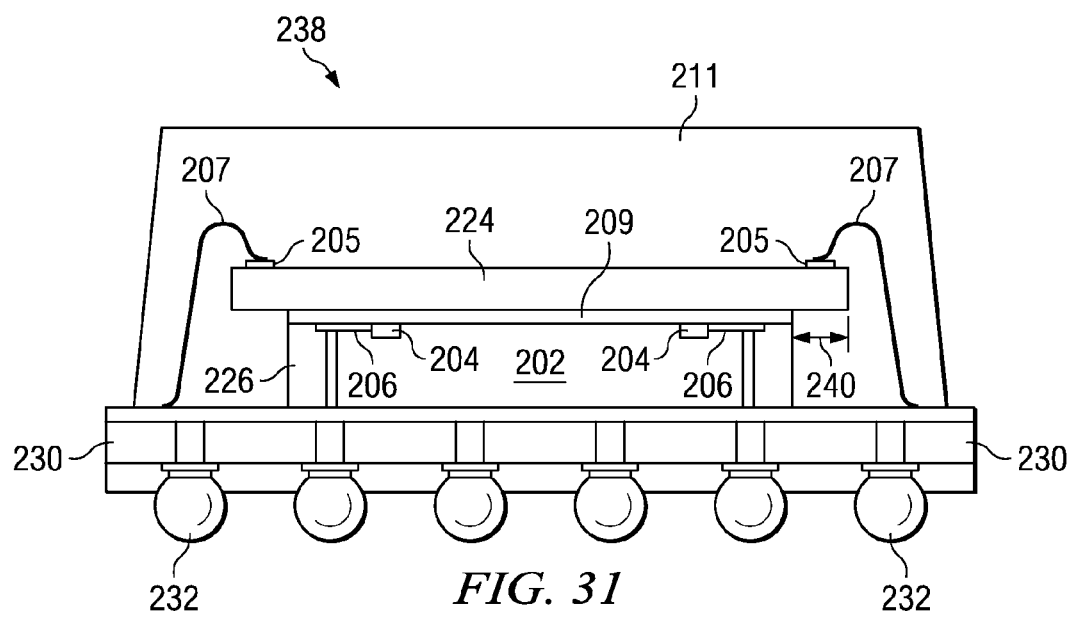
FIG. 31 illustrates a overhanging wire bond die disposed over a THV die.

FIG. 31 illustrates an exemplary package 238, where wire bond die 224 overhangs THV die 202, as denoted by distance arrow 240. The bond pad 205 couples die 224 directly with substrate 230.

Figure 32:
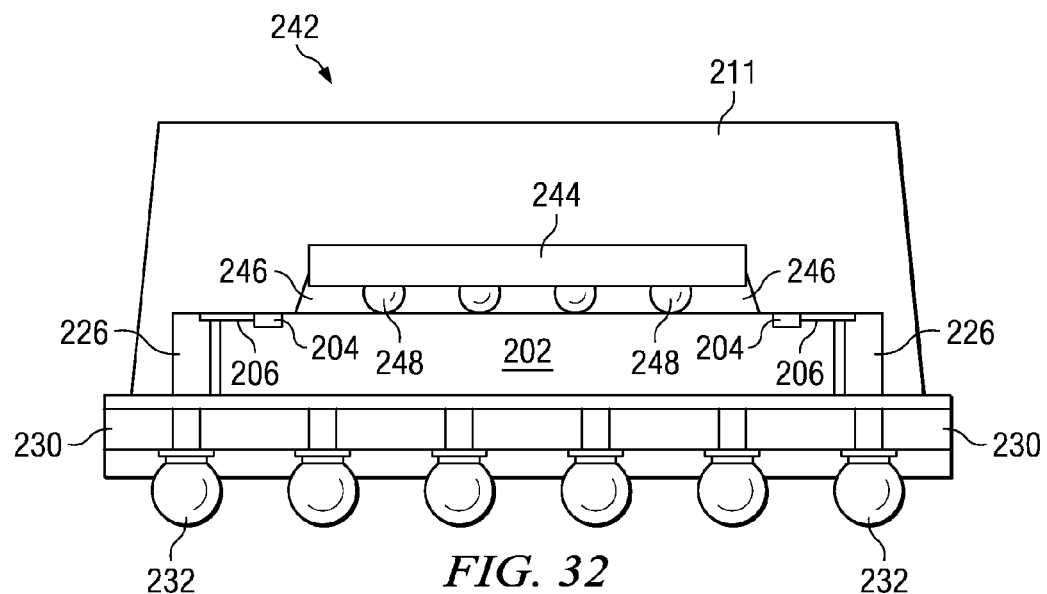
FIG. 32 illustrates a flip chip die disposed over a THV die.

FIG. 32 illustrates a PiP 242 where a flip chip die 244 is disposed above THV die 202 and electrically connected to the RDL/interconnection pads using bumps 248. An optional underfill material 246 is disposed between flip chip die 244 and THV die 202.

Figure 33:
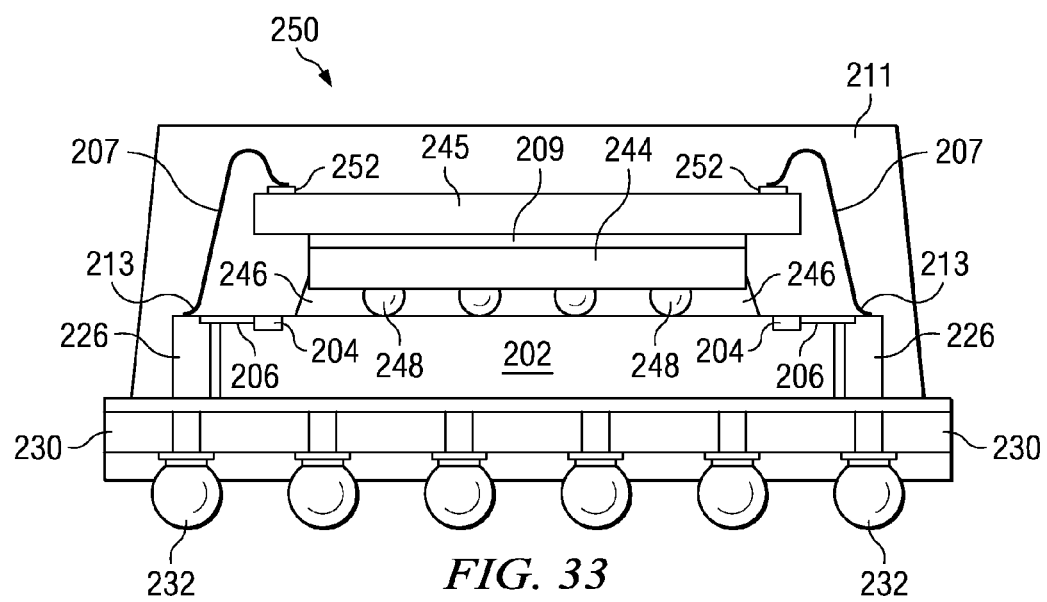
FIG. 33 illustrates a third die disposed over a flip chip die, where the flip chip die is coupled to the THV die.

An overhanging third, wire bond die 245 is disposed above flip chip die 244 in the exemplary PiP 250 shown in FIG. 33. The overhanging wire bond die 245 is wire-bonded from bond pad 252 to via 226 at terminal 213. Again, D/A 209 adheres the overhanging die 245 to flip chip die 244.

Figure 34:
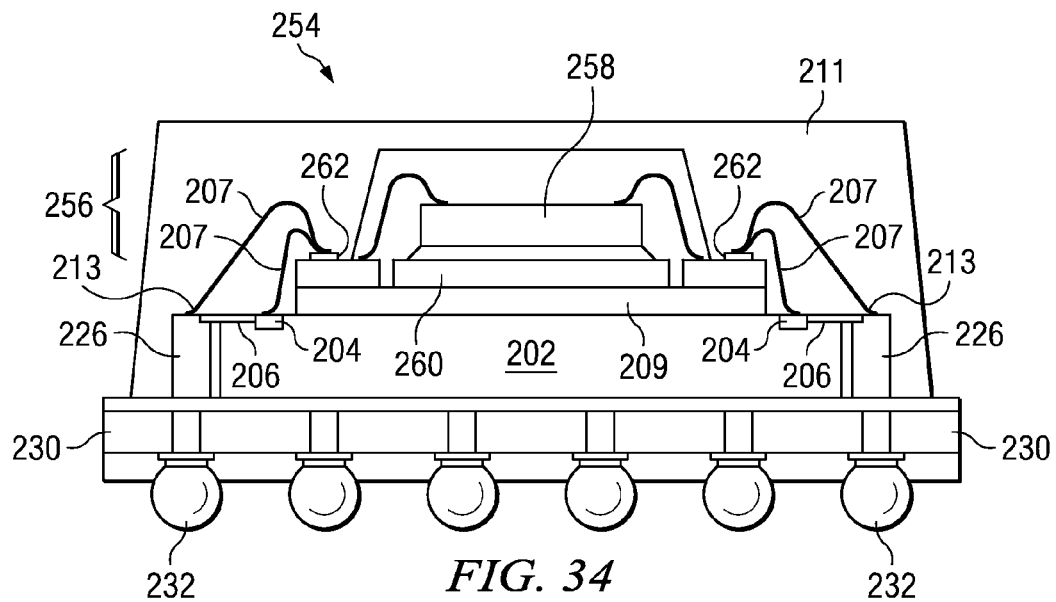
FIG. 34 illustrates a leadframe package disposed over a THV die.

In PiP 254, leadframe package 256 is attached to THV die 202 as shown in FIG. 34. Package 256 includes an incorporated die 258 and die paddle 260, which are attached using D/A 209. A lead terminal 262 allows wires 207 to be coupled to both bond pad 204 and via 226. Package 256 is attached to THV die 202 using D/A 209. Package 256 can include such devices as a quad flat nonlead (QFN) package, small outline nonlead (SON), and quad flat package (QFP), or similar package configurations.

Figure 35:
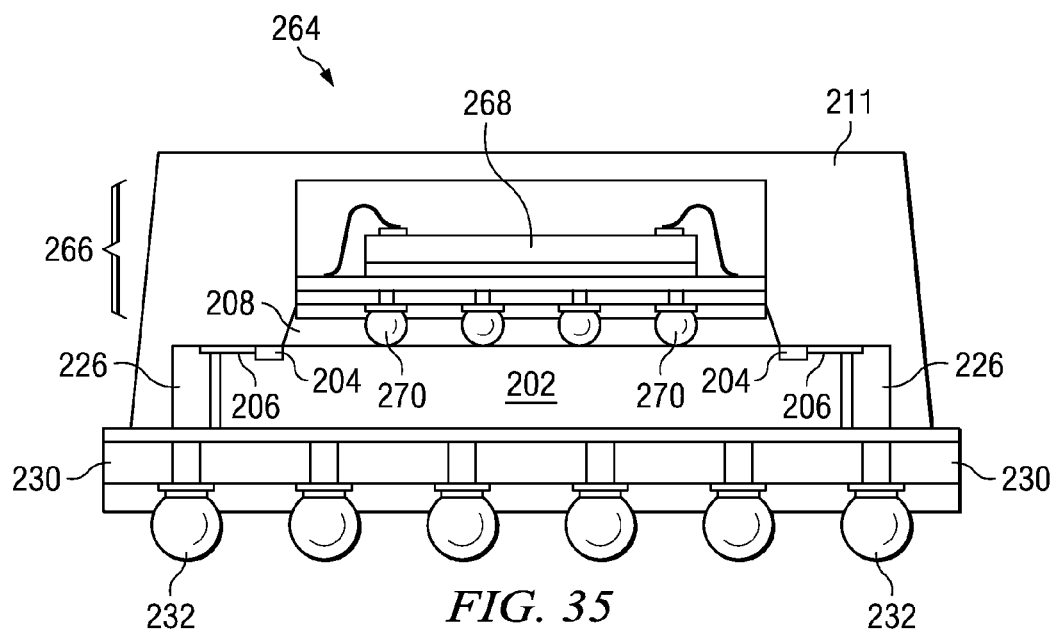
FIG. 35 illustrates an array package disposed over a THV die.

The leadframe package 256 is replaced with array package 266 in FIG. 35, which illustrates exemplary PiP 264. The array package 266 also includes die 268 disposed over a substrate, whose bumps 270 couple the array package 266 to THV die 202 and to RDL/pads. Package 266 can include such devices as a land grid array (LGA), ball grid array (BGA), or similar package configurations. Again, optional underfill material 208 couples package 266 to die 202.

Figure 36:
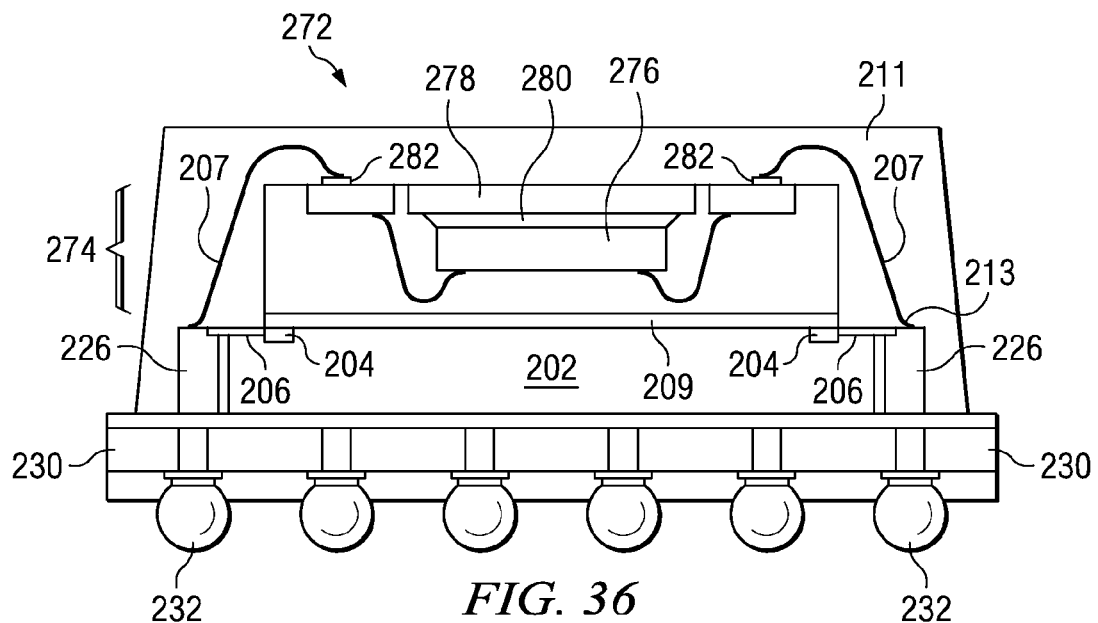
FIG. 36 illustrates an inverted package disposed over a THV die.

FIG. 36 illustrates PiP 272, which incorporates an inverted top package 274. The inverted package 274 also includes die 276 and die paddle 278. A lead terminal 282 wire-bonds package 274 to via 226. The inverted top package 274 can include such devices as a QFN, SON, QFP, LGA, BGA, or similar package configurations.

Figure 37:
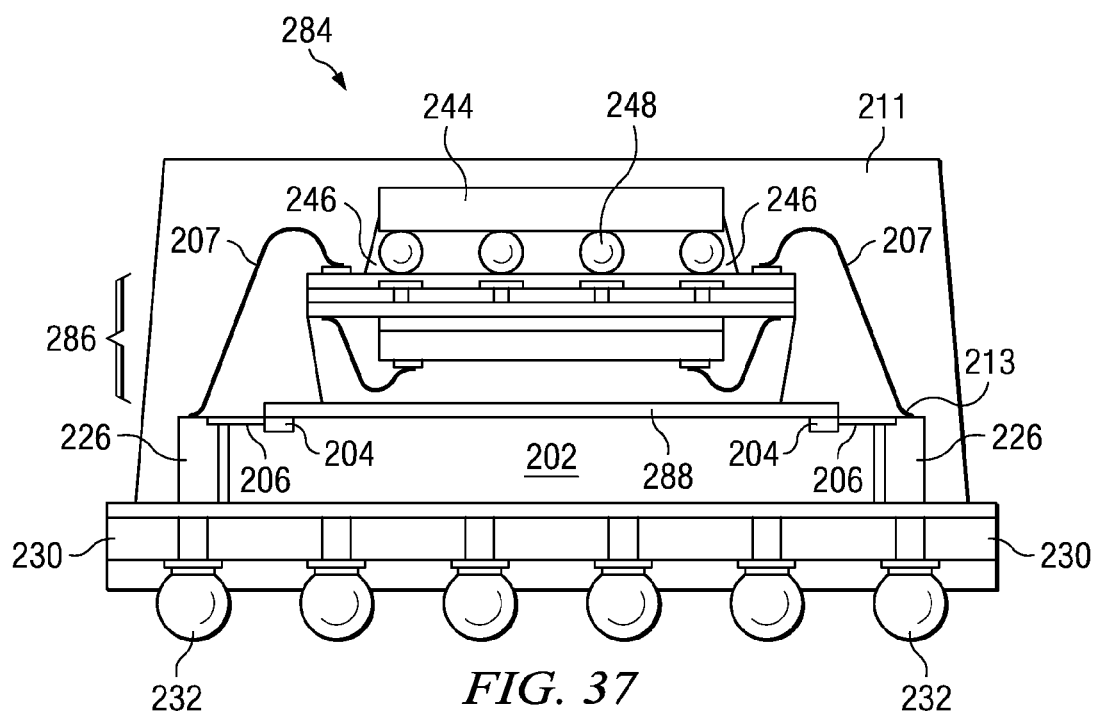
FIG. 37 illustrates an inverted package disposed over a THV die, where a third die is disposed over the integrated package.

FIG. 37 illustrates another package 284 incorporating an inverted top package 286 similar to package 274. Package 286 is adhered to THV die 202 using D/A material 288. A flip chip die 244 is disposed over package 286 as shown, making use of bumps 248 and the optional underfill 246. The flip chip die 244 can include wire bond dies or additional semiconductor integrated circuit packages.

Figure 38:
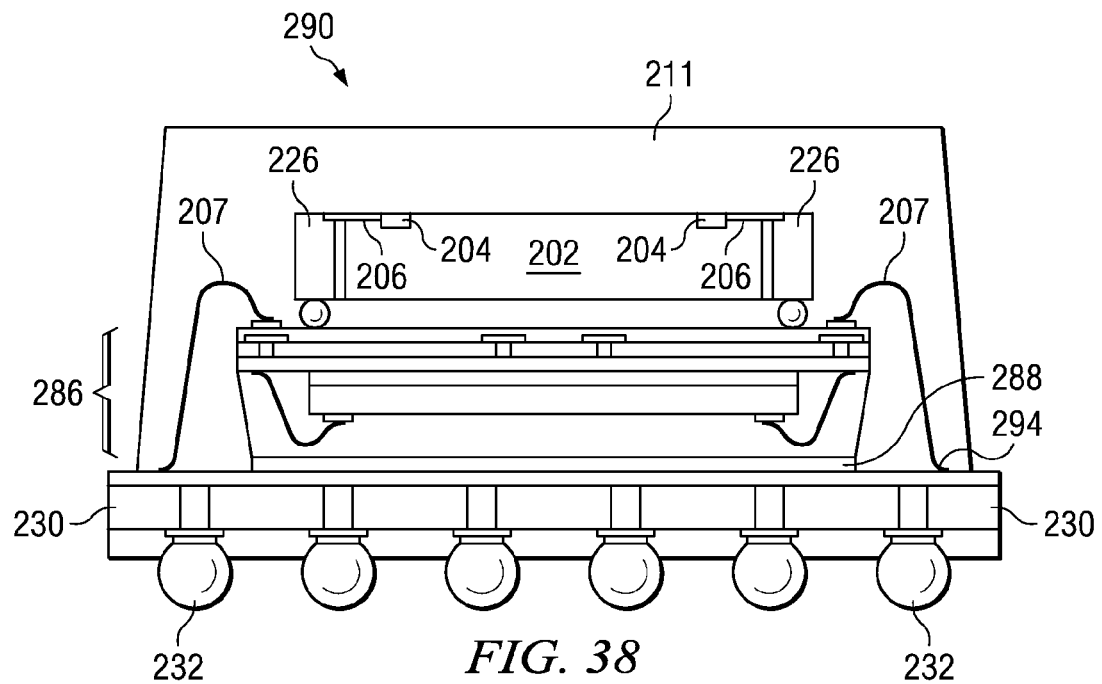
FIG. 38 illustrates a THV die disposed over an inverted package.

FIG. 38 illustrates a PiP 290 configuration where THV die 202 is disposed over inverted package 286 using a plurality of bumps to connect a top surface of package 286 to a bottom surface of vias 226. Again, the inverted bottom package 286 can include such devices as QFN, SON, QFP, LGA, BGA, flip chip bare dies and wafer level packages (WLPs) 286. Package 286 is attached with D/A 288 and wire-bonded to substrate 230 as shown.

Figure 39:
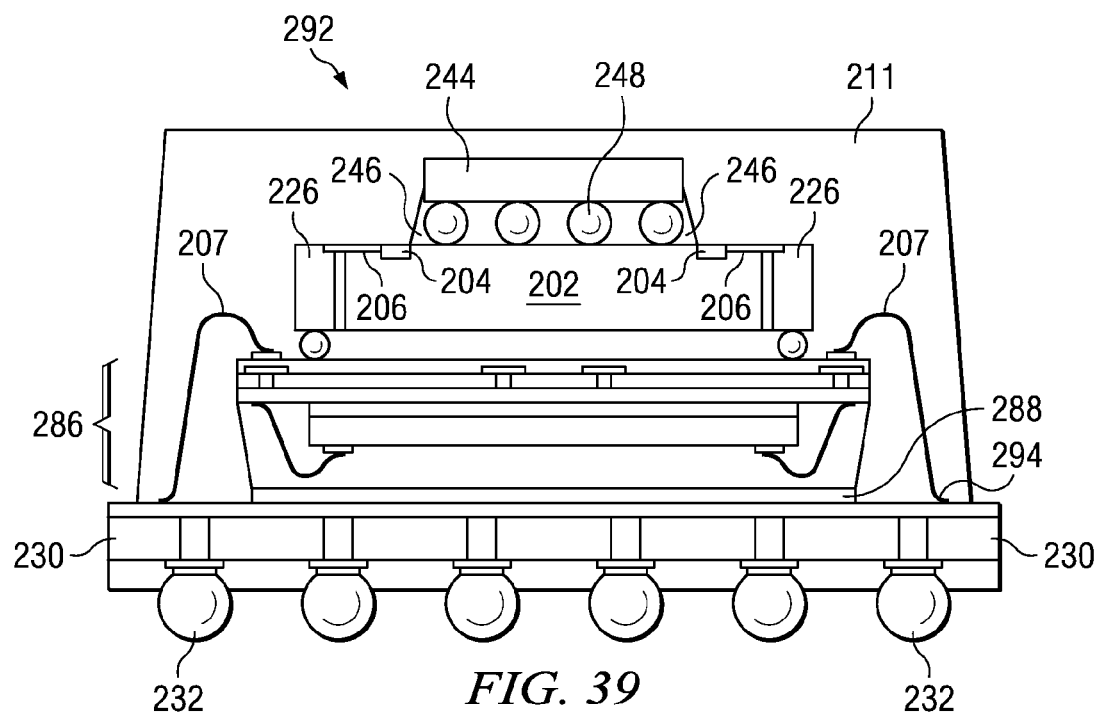
FIG. 39 illustrates a THV die disposed over an inverted package, where a third die is disposed over the THV die.

FIG. 39 illustrates the configuration as shown in FIG. 38 but with additional stacking. Package 292 includes an additional flip chip die 244, which is disposed over a top surface of THV die 202 utilizing bumps 248 and underfill 246 in a manner similar to FIG. 32. Other semiconductor devices such as wire bond die can also be used in place of flip chip die 244.

Figure 40:
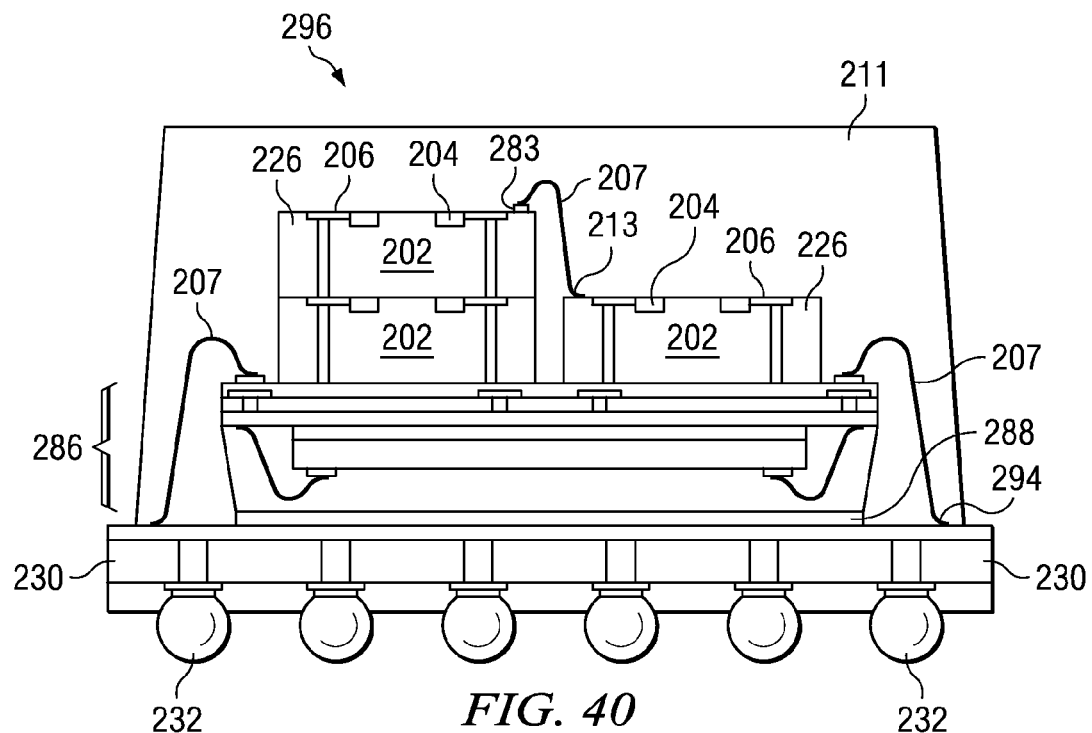
FIG. 40 illustrates a multi-THV die configuration disposed over an inverted package.

Turning to FIG. 40, exemplary PiP 296 incorporates an inverted bottom package 286. In the depicted embodiment, a series of THV dies 202 are stacked, one on top of another, as shown. The bottom surface of the top THV die via 226 is coupled to the top surface of the bottom THV die via 226. The top THV die 202 is wire-bonded from via location 283 to location 213 on the adjacent THV die via.

Figure 41:
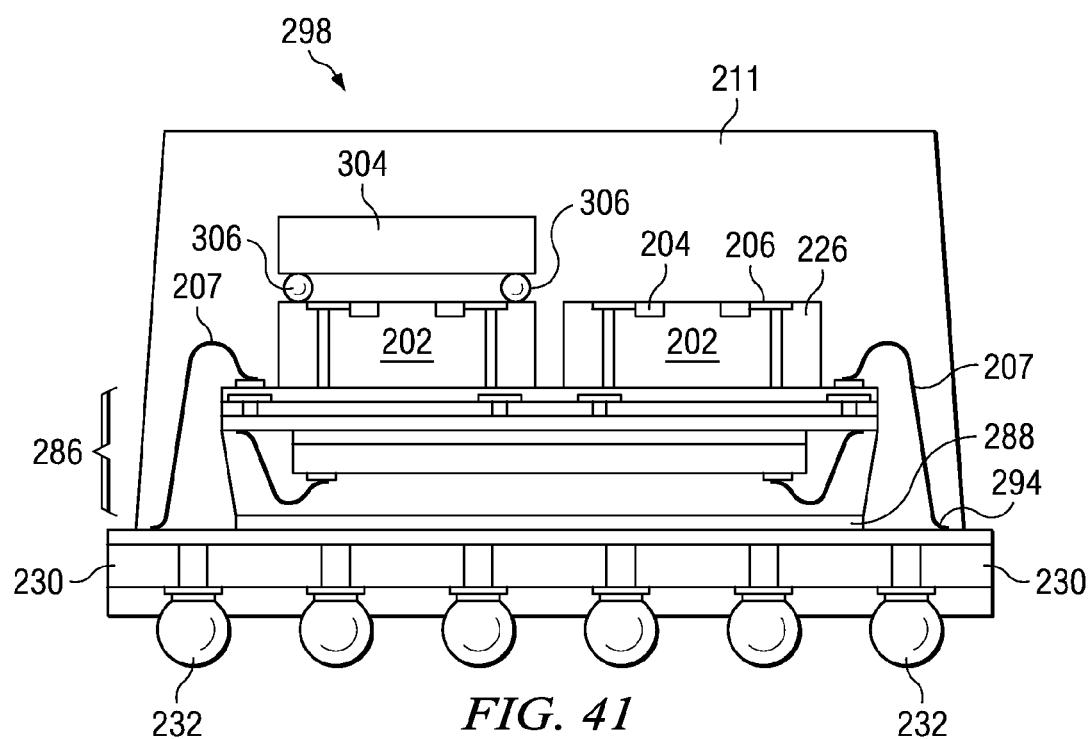
FIG. 41 illustrates a multi-THV die configuration disposed over an inverted package, where an additional die is disposed over a THV die.

In a similar embodiment, THV dies 202 are stacked adjacent to each other over package 286 as shown in FIG. 41. PiP 298 again incorporates the inverted bottom package 286, which is attached to substrate 230 as shown. In the depicted embodiment, an additional flip chip die 304, or similar die 304 or integrated circuit package 304 is disposed over THV die 202 using bumps 306.

Figure 42:
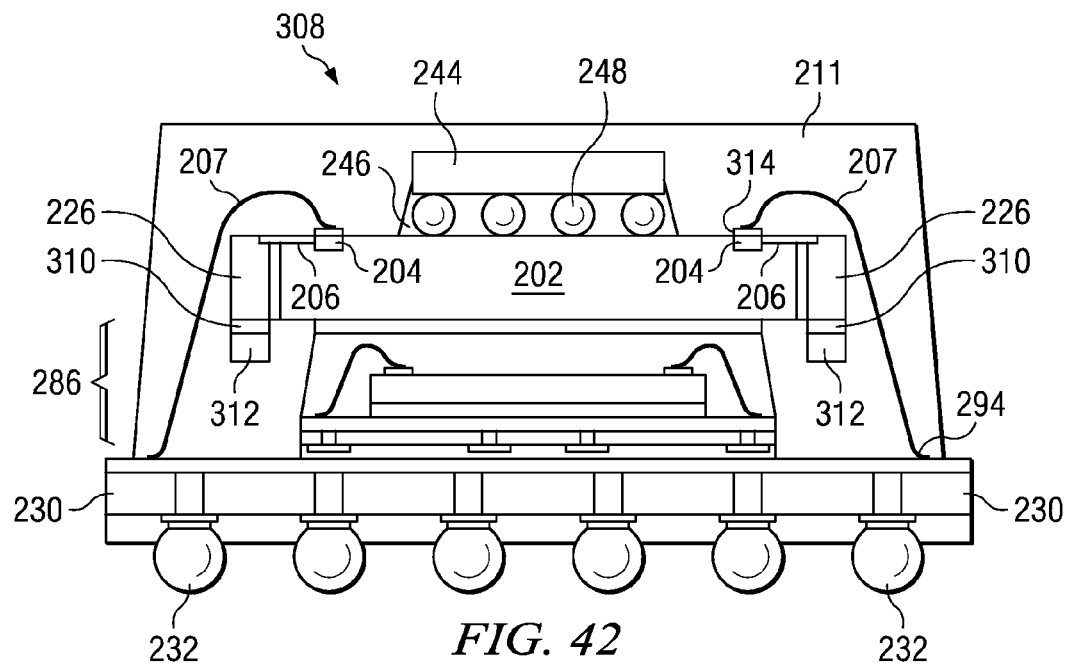
FIG. 42 illustrates a THV die incorporating an under-hang passive device.

FIG. 42 illustrates a package 308 which again incorporates a bottom package 286. A solder paste 310 is coupled to the bottom surface of via 226. A passive device 312, such as an inductor, filter, capacitor, resistor, or similar passive device 312 is coupled to solder paste 310 to provide additional functionality to package 308. In the depicted embodiment, THV die 202 overhangs package 286, allowing the room for passive devices 312. An encapsulant 211 covers portions of all of the components of package 308 as shown to provide structural support. A bond pad 314 couples THV die 202 to substrate 230 at location 294.

Figure 43:
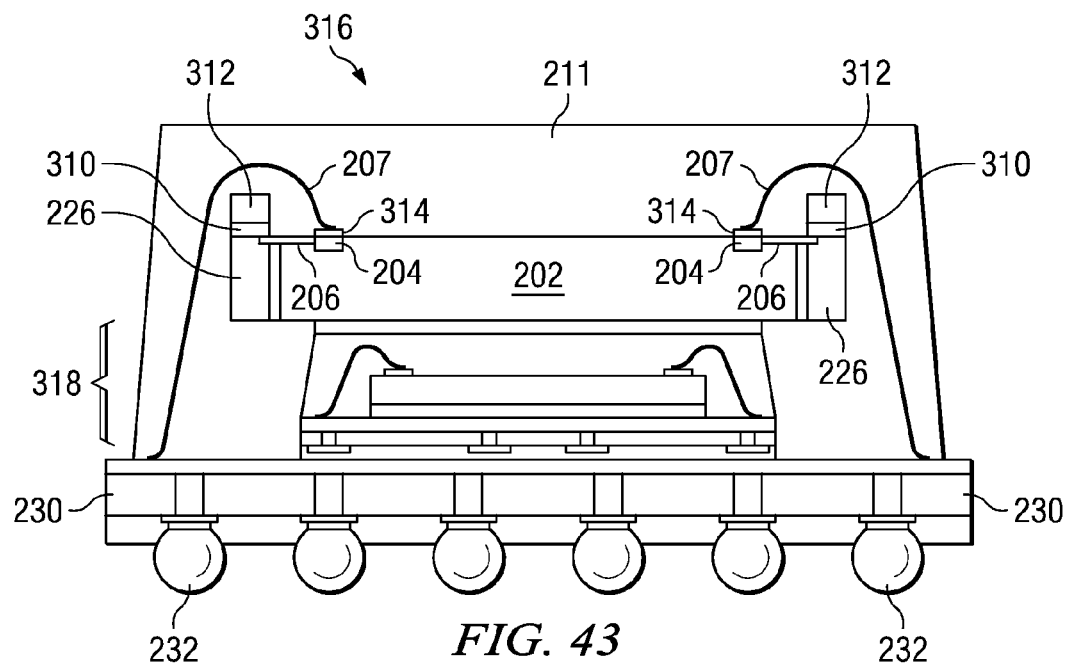
FIG. 43 illustrates a THV die incorporating an over-hang passive device.

In an additional embodiment shown in FIG. 43, PiP 316 again includes THV die 202 with attached passive devices 312 using a solder paste material 310, where devices 312 are attached to the top surface of vias 226. A bottom package 318 can again include such configurations as QFN, SON, QFP, LGA, BGA, flip chip bare dies, and WLP. A bond pad 314 couples THV die 202 through passive device 312 to the substrate using wires 207. Again, an encapsulant 211 is then provided for structural support of package 316.

As the various PiP embodiments illustrate, a variety of innovative, robust, flexible, and efficient PiP configurations can be realized using THV 226 of THV die 202.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
    a first semiconductor die;
    an insulating material disposed around a peripheral region of the first semiconductor die including a first surface of the insulating material coplanar with a first surface of the first semiconductor die;
    a conductive via formed through the insulating material with a side surface of the conductive via coplanar with a side surface of the insulating material;
    a bond pad formed on the first surface of the first semiconductor die;
    a conductive trace formed between the bond pad and the conductive via; and
    a second semiconductor die disposed over the first surface of the first semiconductor die.

2. The semiconductor device of claim 1, further including an encapsulant deposited over the second semiconductor die and around the insulating material, wherein the encapsulant contacts the side surface of the conductive via.

3. The semiconductor device of claim 1, further including a third semiconductor die disposed over the first semiconductor die or the second semiconductor die.

4. The semiconductor device of claim 1, further including a bond wire mechanically bonded to a first surface of the conductive via coplanar with the first surface of the first semiconductor die and the first surface of the insulating material.

5. The semiconductor device of claim 1, further including a substrate, wherein the first semiconductor die is disposed over the substrate.

6. A semiconductor device, comprising:
    a first semiconductor die;
    an insulating material disposed around a peripheral region of the first semiconductor die including a surface of the insulating material coplanar with a surface of the first semiconductor die;
    a conductive via formed through the insulating material with a top surface, a side surface, and a bottom surface of the conductive via exposed from the insulating material;
    a bond pad formed on the surface of the first semiconductor die; and
    a conductive trace coupled between the conductive via and the bond pad.

7. The semiconductor device of claim 6, further including:
    a second semiconductor die disposed over the first semiconductor die; and
    an encapsulant deposited over the second semiconductor die and contacting the insulating material.

8. The semiconductor device of claim 7, further including a third semiconductor die disposed over the first semiconductor die or the second semiconductor die.

9. The semiconductor device of claim 8, wherein the third semiconductor die overhangs the second semiconductor die.

10. The semiconductor device of claim 7, wherein the second semiconductor die overhangs the first semiconductor die.

11. The semiconductor device of claim 7, further including a bond wire electrically coupled to the first semiconductor die or the second semiconductor die.

12. The semiconductor device of claim 6, further including an integrated passive device disposed over the first semiconductor die.

13. A semiconductor device, comprising:
    a first semiconductor die;
    an insulating material disposed around a peripheral region of the first semiconductor die;
    a half-cut conductive via formed through the insulating material; and
    a conductive layer formed on a surface of the first semiconductor die and a surface of the insulating material and coupled to the conductive via.

14. The semiconductor device of claim 13, further including a bond pad formed over the surface of the first semiconductor die and coupled to the conductive via through the conductive layer.

15. The semiconductor device of claim 13, further including an encapsulant deposited over the first semiconductor die and contacting the insulating material.

16. The semiconductor device of claim 13, further including a second semiconductor die disposed over the first semiconductor die.

17. The semiconductor device of claim 16, further including a third semiconductor die disposed over the first semiconductor die or the second semiconductor die.

18. The semiconductor device of claim 16, further including a bond wire electrically coupled to the first semiconductor die or the second semiconductor die.

19. A semiconductor device, comprising:
a first semiconductor die;
an insulating material disposed around a peripheral region of the first semiconductor die;
a conductive via formed through the insulating material with a side surface of the conductive via exposed at a side surface of the insulating material; and
a conductive trace formed on a surface of the first semiconductor die and extending to the conductive via.

20. The semiconductor device of claim 19, further including an encapsulant deposited over the first semiconductor die.

21. The semiconductor device of claim 19, further including a second semiconductor die disposed over the first semiconductor die.

22. The semiconductor device of claim 21, further including a third semiconductor die disposed over the first semiconductor die or the second semiconductor die.

23. The semiconductor device of claim 21, further including a bond wire electrically connected to the first semiconductor die or the second semiconductor die.

* * * * *